United States Patent
Luong

(10) Patent No.: US 11,659,300 B2
(45) Date of Patent: May 23, 2023

(54) SOLID-STATE IMAGE SENSOR, METHOD OF DRIVING SOLID-STATE IMAGE SENSOR, AND ELECTRONIC APPARATUS

(71) Applicant: SONY SEMICONDUCTOR SOLUTIONS CORPORATION, Kanagawa (JP)

(72) Inventor: Hung Luong, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/680,965

(22) Filed: Feb. 25, 2022

(65) Prior Publication Data

US 2022/0295005 A1    Sep. 15, 2022

Related U.S. Application Data

(63) Continuation of application No. 16/647,951, filed as application No. PCT/JP2018/033201 on Sep. 7, 2018, now Pat. No. 11,284,033.

(30) Foreign Application Priority Data

Oct. 13, 2017  (JP) ................................. 2017-199118

(51) Int. Cl.
*H01L 27/14* (2006.01)
*H04N 25/75* (2023.01)
(Continued)

(52) U.S. Cl.
CPC ....... *H04N 25/75* (2023.01); *H01L 27/14641* (2013.01); *H04N 25/57* (2023.01); *H04N 25/77* (2023.01)

(58) Field of Classification Search
CPC ........ H04N 25/75; H04N 25/57; H04N 25/77; H04N 25/60; H04N 25/79; H04N 25/59; H01L 27/14641; H01L 27/14634
See application file for complete search history.

(56) References Cited

U.S. PATENT DOCUMENTS

2009/0046189 A1 * 2/2009 Yin ..................... H04N 5/37457
                                                                    348/308
2012/0256078 A1    10/2012 Mabuchi
(Continued)

FOREIGN PATENT DOCUMENTS

CN          102740005 A       10/2012
CN          103140926 A       6/2013
(Continued)

OTHER PUBLICATIONS

International Preliminary Report on Patentability of PCT Application No. PCT/JP2018/033201, dated Apr. 23, 2020, 11 pages of English Translation and 06 pages of IPRP.

(Continued)

*Primary Examiner* — Tony Ko
(74) *Attorney, Agent, or Firm* — Chip Law Group

(57) ABSTRACT

A solid-state image sensor includes a pixel array section including a plurality of unit pixels each having a photoelectric conversion unit, the plurality of unit pixels being arranged in a matrix, a constant current source circuit unit having a constant current source connected to each of vertical signal lines provided in association with column arrangement of the pixel array section; and a control unit configured to control the constant current source circuit unit. The constant current source includes a plurality of transistors. The control unit switches, in a case where the plurality of transistors constituting the constant current source is regarded as one transistor having a gate width and a gate length being equivalent to each other, a ratio between the (Continued)

gate width and the gate length of the plurality of transistors on the basis of illumination in image-capturing environment.

17 Claims, 15 Drawing Sheets

(51) Int. Cl.
*H01L 27/146* (2006.01)
*H04N 25/57* (2023.01)
*H04N 25/77* (2023.01)

(56) References Cited

U.S. PATENT DOCUMENTS

| | | |
|---|---|---|
| 2013/0175652 A1 | 7/2013 | Yamazaki et al. |
| 2016/0037106 A1 | 2/2016 | Ohmaru |
| 2018/0048838 A1 | 2/2018 | Nakamizo |

FOREIGN PATENT DOCUMENTS

| | | |
|---|---|---|
| JP | 08-077209 A | 3/1996 |
| JP | 2007-535199 A | 11/2007 |
| JP | 2008-205638 A | 9/2008 |
| JP | 2012-079861 A | 4/2012 |
| JP | 2012-222529 A | 11/2012 |
| KR | 10-2012-0114161 A | 10/2012 |
| WO | 2012/042782 A1 | 4/2012 |
| WO | 2016/147887 A1 | 9/2016 |

OTHER PUBLICATIONS

International Search Report and Written Opinion of PCT Application No. PCT/JP2018/033201, dated Nov. 20, 2018, 11 pages of English Translation and 09 pages of ISRWO.

Notice of Allowance for U.S. Appl. No. 16/647,951, dated Nov. 18, 2021, 05 pages.

Non-Final Office Action for U.S. Appl. No. 16/647,951, dated Jul. 6, 2021, 06 pages.

\* cited by examiner

TO ANALOG-TO-DIGITAL
CONVERSION UNIT

FIG. 11

| ANALOG GAIN VALUE | | CONFIGURATION OF CONSTANT CURRENT SOURCE | |
|---|---|---|---|
| LOW GAIN ⇔ HIGH GAIN | AG < THRESHOLD 1 | CONFIGURATION 1 | RANGE PRIORITY ⇔ NOISE PRIORITY |
| | THRESHOLD 1 ≦ AG < THRESHOLD 2 | CONFIGURATION 2 | |
| | THRESHOLD 2 ≦ AG < THRESHOLD 3 | CONFIGURATION 3 | |
| | ... | ... | |
| | THRESHOLD i-1 ≦ AG < THRESHOLD i | CONFIGURATION i | |
| | AG ≧ THRESHOLD i | CONFIGURATION i+1 | |

SOLID-STATE IMAGE SENSOR, METHOD OF DRIVING SOLID-STATE IMAGE SENSOR, AND ELECTRONIC APPARATUS

CROSS REFERENCE TO RELATED APPLICATIONS

This application is continuation application of U.S. patent application Ser. No. 16/647,951 filed on Mar. 17, 2020, which is a U.S. National Phase of International Patent Application No. PCT/JP2018/033201 filed on Sep. 7, 2018, which claims priority benefit of Japanese Patent Application No. JP 2017-199118 filed in the Japan Patent Office on Oct. 13, 2017. Each of the above-referenced applications is hereby incorporated herein by reference in its entirety.

TECHNICAL FIELD

The present disclosure relates to a solid-state image sensor, a method of driving the solid-state image sensor, and an electronic apparatus.

BACKGROUND ART

In a solid-state image sensor, for the purpose of increasing the dynamic range, it is necessary to read out a pixel signal with low noise upon image-capturing in low-illumination environment and also it is necessary to increase an input voltage range of a circuit so that the pixel signal can be read out even upon image-capturing in high-illumination environment. On the other hand, the refinement or power saving in the device process causes the necessity for power supply voltage reduction to be larger and makes it difficult to satisfy the opposing requirements between the increase in the circuit input voltage range and the reduction in the circuit noise.

In the related art, techniques of the pixel configuration allowing the capacitance of floating diffusion to be switchable and the conversion efficiency in converting signal charges into voltage signals to be variable for the purpose of increasing the dynamic range are disclosed (e.g., Patent Documents 1 and 2).

In these techniques of the related art disclosed in Patent Documents 1 and 2, a large amount of signal electrons is converted into a small voltage signal by setting the conversion efficiency low in the case where a pixel signal upon image-capturing in high-illumination environment is read out. On the other hand, in the case where a pixel signal upon image-capturing in low-illumination environment is read out, circuit noise occurring in the pixel signal readout circuit can be input and converted to fewer electrons by setting the conversion efficiency high, which is advantageous for the reduction of noise.

CITATION LIST

Patent Document

Patent Document 1: PCT Japanese Translation Patent Publication No. 2007-535199
Patent Document 2: Japanese Patent Application Laid-Open No. 2008-205638

SUMMARY OF THE INVENTION

Problems to be Solved by the Invention

However, the techniques of the related art disclosed in Patent Documents 1 and 2 necessitate a transistor for switching the conversion efficiency or a large capacitor for obtaining low conversion efficiency to achieve switching between low efficiency and high efficiency of pixel conversion efficiency. Thus, it is necessary to prepare a region for providing the transistor to switch the conversion efficiency or the large capacitor, which causes problems of lowering the aperture ratio of the pixel.

In view of this, the present disclosure provides a solid-state image sensor capable of increasing a dynamic range without causing a decrease in the aperture ratio of a unit pixel, a method of driving the solid-state image sensor, and an electronic apparatus including the solid-state image sensor.

Solutions to Problems

A solid-state image sensor according to an embodiment of the present disclosure to achieve the above-mentioned object includes
a pixel array section including a plurality of unit pixels each having a photoelectric conversion unit, the plurality of the unit pixels being arranged in a matrix;
a constant current source circuit unit having a constant current source connected to each of vertical signal lines provided in association with column arrangement of the pixel array section; and
a control unit configured to control the constant current source circuit unit, in which the constant current source includes a plurality of transistors, and the control unit switches,
in a case where the plurality of transistors constituting the constant current source is regarded as one transistor having a gate width and a gate length being equivalent to each other, a ratio between the gate width and the gate length of the plurality of transistors on the basis of illumination in image-capturing environment. Furthermore, an electronic apparatus according to an embodiment of the present disclosure for achieving the above object includes the solid-state image sensor having the configuration described above.

A method of driving the solid-state image sensor according to an embodiment of the present disclosure to achieve the above-mentioned object includes,
in a case of driving the solid-state image sensor provided with a pixel array section including a plurality of unit pixels each having a photoelectric conversion unit, the plurality of unit pixels being arranged in a matrix, and
a constant current source circuit unit having a constant current source connected to each of vertical signal lines provided in association with column arrangement of the pixel array section,
switching, in a case where a plurality of transistors constituting the constant current source is regarded as one transistor having a gate width and a gate length being equivalent to each other, a ratio between the gate width and the gate length of the plurality of transistors on the basis of illumination in image-capturing environment.

The switching of the ratio between the gate width and the gate length of the plurality of transistors constituting the constant current source on the basis of illumination in image-capturing environment makes it possible for the constant current source to achieve the increase in the input voltage range and the optimization in the readout of the pixel signal with low noise without changing the circuit configuration or layout on the side of the unit pixel.

Effects of the Invention

According to the present disclosure, it is possible for the constant current source to achieve the optimization of the input voltage range and noise, resulting in increasing the dynamic range without causing a decrease in the aperture ratio of the unit pixel.

Note that the effect described here is not a limitation necessarily, but one of the effects described in the present specification may be achieved. Also, the effect described in the present specification is just an example and is not limited thereto, and an additional effect may be enabled.

BRIEF DESCRIPTION OF DRAWINGS

FIG. 11 is a diagram illustrating a relationship between analog gain values set in a plurality of stages and a configuration of the constant current source in the fourth example.

MODE FOR CARRYING OUT THE INVENTION

Figure 1:
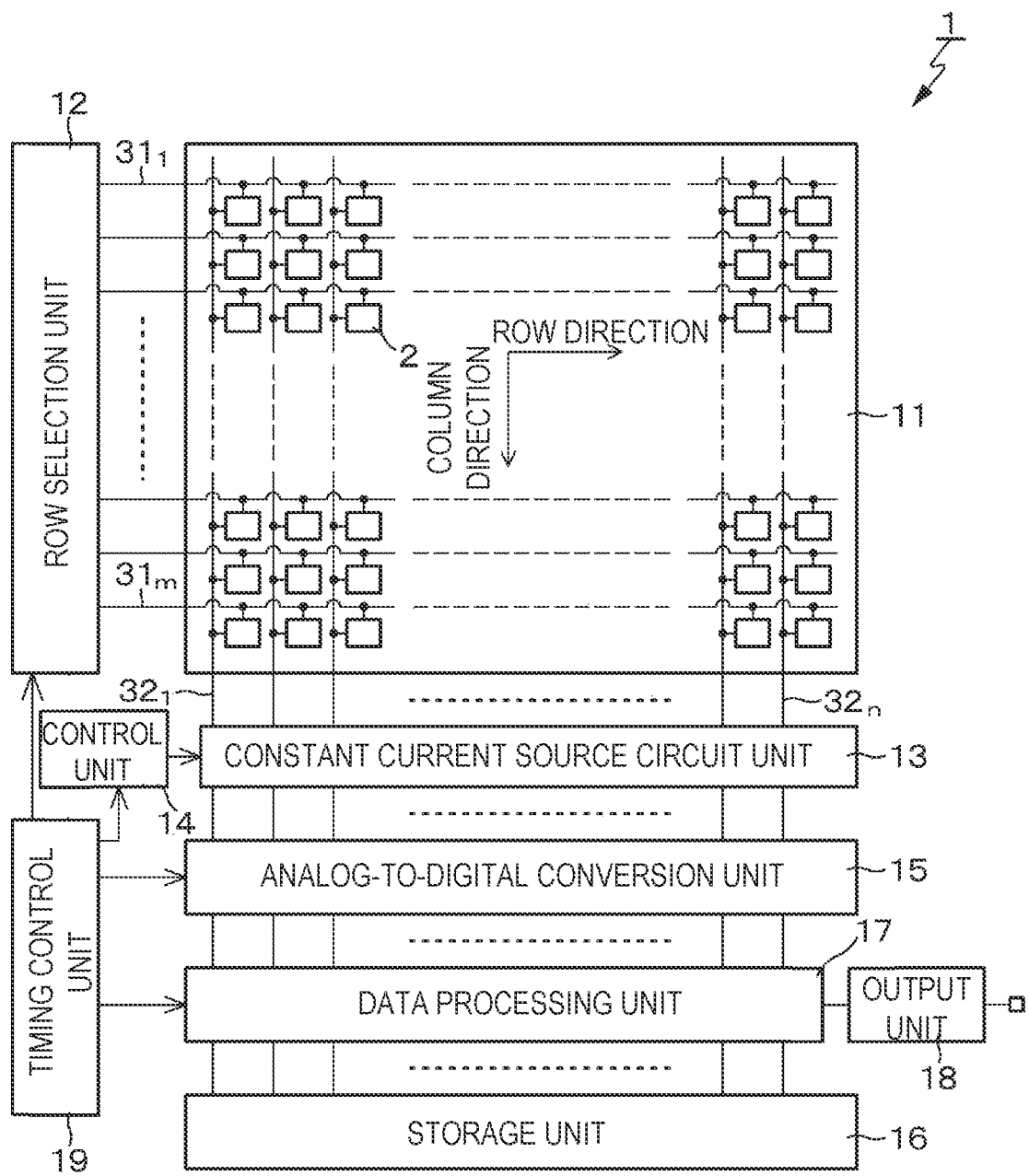
FIG. 1 is a block diagram illustrating schematic basic configuration of the CMOS image sensor according to an embodiment of the present disclosure.

In the following, a mode for carrying out the technology of the present disclosure (hereinafter, referred to as "embodiment") will be described in detail by using drawings. The technology of the present disclosure is not limited to the embodiment, and various numerical values in embodiments are examples. In the below description, the same reference signs are used for the same elements or the elements having the same function, and repetitive description is omitted. Note that description will be made in the following order.

1. Overall description of solid-state image sensor, driving method thereof, and electronic apparatus of present disclosure
2. Solid-state image sensor of present disclosure
2-1. Exemplary configuration of CMOS image sensor
2-2. Exemplary configuration of unit pixel
2-3. Exemplary circuit operation of unit pixel
2-4. Stacked structure
2-5. Technique in related art for increasing dynamic range
2-6. Description of embodiment
2-6-1. First example (example of connecting two transistors in series)
2-6-2. Second example (example of connecting two transistors in parallel)
2-6-3. Third example (example of combination of first and second examples)
2-6-4. Fourth example (example of associating optimization of configuration of constant current source correspondingly with analog gain)
3. Modification example
4. Application example
5. Applied example of technology according to present disclosure
5-1. Electronic apparatus of present disclosure (example of image-capturing device)
5-2. Application example to moving object
6. Configuration achievable by employing present disclosure <Overall Description of Solid-State Image Sensor, Driving Method Thereof, and Electronic Apparatus of Present Disclosure>

In a solid-state image sensor, a driving method thereof, and an electronic apparatus of the present disclosure, it is possible for a control unit to have a configuration of switching a ratio between width and length of gates of a plurality of transistors between upon image-capturing in low-illumination environment and upon image-capturing in high-illumination environment.

Furthermore, the solid-state image sensor, the driving method thereof, and the electronic apparatus of the present disclosure including the above-described preferable configuration are capable of setting a mode between a noise priority mode that is set upon image-capturing in low-illumination environment and a range priority mode that is set upon image-capturing in high-illumination environment. In this case, there is provided a control unit capable of switching a ratio between gate width and gate length of gates of a plurality of transistors depending on the priority mode to be set.

Furthermore, in the solid-state image sensor, the driving method thereof, and the electronic apparatus of the present disclosure including the above-described preferable configuration, the control unit is capable of switching a connection state between a plurality of transistors that constitutes a constant current source and switching a setting of a gate bias of the plurality of transistors, depending on the priority mode to be set. In addition, the control unit preferably has a configuration of relatively increasing the ratio between the gate width and the gate length upon setting the range priority mode and relatively decreasing the ratio between the gate width and the gate length upon setting the noise priority mode.

Furthermore, in the solid-state image sensor, the driving method thereof, and the electronic apparatus of the present disclosure including the above-described preferable configuration, the constant current source is capable of having first and second transistors and a switch element. The first and second transistors are connected in series between a vertical signal line and a reference potential node. The switch element is connected in parallel to one of the first transistor and the second transistor. In addition, the control unit is capable of turning on the switch element upon image-capturing in high-illumination environment and turning off the switch element upon image-capturing in low-illumination environment.

Further, in the solid-state image sensor, the driving method thereof, and the electronic apparatus of the present disclosure including the above-described preferable configuration, the constant current source is capable of having first and second transistors connected in parallel between a vertical signal line and a reference potential node. In addition, the control unit is capable of applying a gate bias voltage to the first and second transistors upon image-capturing in high-illumination environment, and applying the gate bias voltage to one of the first and second transistors and turning off the other one upon image-capturing in low-illumination environment.

Further, in the solid-state image sensor, the driving method thereof, and the electronic apparatus of the present disclosure including the above-described preferable configuration, the constant current source is capable of having a first switch element, a first transistor, a second transistor, a second switch element, and a third switch element. The first switch element and the first transistor are connected in series between a vertical signal line and a reference potential node. The second transistor and the second switch element are connected in series between the vertical signal line and the reference potential node. The third switch element is connected between a connection node between the first switch element and the first transistor and a connection node between the second transistor and the second switch element. Further, the control unit turns off the first switch element and the second switch element and turns on the third switch element upon image-capturing in low-illumination environment, and turns on the first switch element and the second switch element and turns off the third switch element upon image-capturing in high-illumination environment Further, the solid-state image sensor, the driving method thereof, and the electronic apparatus of the present disclosure including the above-described preferable configuration are capable of setting an analog gain to a pixel signal that is read out from a unit pixel through a vertical signal line. In addition, the control unit is capable of switching a ratio between the gate width and the gate length of a plurality of transistors depending on the analog gain to be set.

Further, in the solid-state image sensor, the driving method thereof, and the electronic apparatus of the present disclosure including the above-described preferable configuration, the analog gain is capable of being set in a plurality of stages. In this case, the control unit is capable of switching the ratio between the gate width and the gate length in a plurality of stages depending on the analog gain to be set. In addition, the control unit is capable of switching a connection state between the plurality of transistors that constitutes the constant current source and switching a setting of the gate bias of the plurality of transistors depending on the analog gain to be set.

Furthermore, the solid-state image sensor, the driving method thereof and the electronic apparatus according to the present disclosure including the preferable configuration described above are capable of including the configuration having a stacked structure in which at least two semiconductor substrates of a first semiconductor substrate and a second semiconductor substrate are arranged on top of each other. At this time, a pixel array section is preferably formed on the first semiconductor substrate, and the constant current source circuit unit is preferably formed on a substrate other than the first semiconductor substrate.

<Solid-State Image Sensor of Present Disclosure>

[Basic Configuration]

The basic configuration of the solid-state image sensor according to the present disclosure is first described. The present embodiment is described as a solid-state image sensor by exemplifying a complementary metal-oxide semiconductor (CMOS) image sensor that is one type of solid-state image sensors employing an X-Y address method. The CMOS image sensor is an image sensor fabricated by applying or partially using the CMOS process.

FIG. 1 is a block diagram illustrating schematic basic configuration of the CMOS image sensor according to an embodiment of the present disclosure. The CMOS image sensor 1 according to the present embodiment includes a pixel array section 11 in which a unit pixel 2 (hereinafter, sometimes simply referred to as "pixel") having a photoelectric conversion unit and a peripheral circuit section in the vicinity of the pixel array section 11. Here, the unit pixels are two-dimensionally arranged in a row direction and a column direction, that is, in a matrix. In this description, the row direction refers to the direction of the unit pixels 2 arranged in the pixel row (what is called, horizontal direction), and the column direction refers to the direction of the unit pixels 2 arranged in the pixel column (what is called, vertical direction). The unit pixel 2 performs photoelectric conversion to perform operations to generate and accumulate photoelectric charge corresponding to quantity of the received light.

The peripheral circuit section in the vicinity of the pixel array section 11 includes, in one example, a row selection unit 12, a constant current source circuit unit 13, a constant current source control unit 14, an analog-to-digital conversion unit 15, a storage unit 16, a data processing unit 17, an output unit 18, and a timing control unit 19, or the like.

The CMOS image sensor 1 according to the present embodiment is capable of setting the noise priority mode and the range priority mode in response to the determination by the user. The noise priority mode is a mode in which priority is given to an operation of reading out a pixel signal from the unit pixel 2 with low noise. The range priority mode is a mode in which priority is given to an operation of increasing an input voltage range of a readout circuit, including the constant current source circuit unit 13, which reads out the pixel signal from the unit pixel 2. The constant current source control unit 14 obtains information regarding the priority mode that is set in response to the determination by the user.

The pixel array section 11 has the matrix pixel arrangement including a pixel drive line 31 and a vertical signal line 32. The pixel drive lines $31_1$-$31_m$ (hereinafter sometimes collectively referred to as "pixel drive line 31") are wired along the row direction for each pixel row, and the vertical signal lines $32_1$-$32_n$ (hereinafter sometimes collectively referred to as "vertical signal line 32") are wired along the column direction for each pixel column. The pixel drive line 31 transmits, upon reading out a signal from the unit pixel 2, a drive signal used to drive it. The pixel drive line 31 is illustrated as one wiring in FIG. 1, but it's number is not limited to one. One end of the pixel drive line 31 is connected to an output end associated with each row of the row selection unit 12.

The description of each circuit unit of the peripheral circuit section in the vicinity of the pixel array section 11, that is, the row selection unit 12, the constant current source circuit unit 13, the constant current source control unit 14, the analog-to-digital conversion unit 15, the storage unit 16, the data processing unit 17, the output unit 18, and the timing control unit 19 is now given.

The row selection unit 12 includes a shift register, an address decoder, or the like, and drives each pixel 2 of the pixel array section 11 at the same time for all pixels or in units of rows. In other words, the row selection unit 12 and the timing control unit 19 that controls the row selection unit 12 constitute a drive unit that drives each pixel 2 of the pixel array section 11. Although the specific configuration of the row selection unit 12 is not illustrated, the row selection unit 12 typically includes two scanning systems, a readout scanning system and a sweeping scanning system.

The readout scanning system selectively scans the unit pixels 2 of the pixel array section 11 sequentially in units of rows to read out pixel signals from the unit pixels 2. The pixel signal read from the unit pixel 2 is an analog signal. The sweeping scanning system performs sweeping scanning with respect to the readout row on which the readout scanning is performed by the readout scanning system prior to the readout scanning by the time corresponding to the shutter speed.

The sweeping scanning by the sweeping scanning system sweeps out unnecessary electric charge from the photoelectric conversion unit of the unit pixel 2 in the readout row, thereby resetting the photoelectric conversion unit. Thus, this sweeping (resetting) of unnecessary electric charge by the sweeping scanning system enables, what is called, electronic shutter operation to be performed. In this description, the electronic shutter operation refers to an operation for sweeping out photoelectric charge of the photoelectric conversion unit and starting new exposure (starting accumulation of photoelectric charge).

The signal read out by the readout scanning system performing the readout operation corresponds to the amount of light received subsequent to the immediately preceding readout operation or the electronic shutter operation. Then, the period from the readout timing at the immediately preceding readout operation or the sweeping timing at the electronic shutter operation to the readout timing at the current read operation is the photoelectric charge exposure period in the unit pixel 2.

Figure 2:
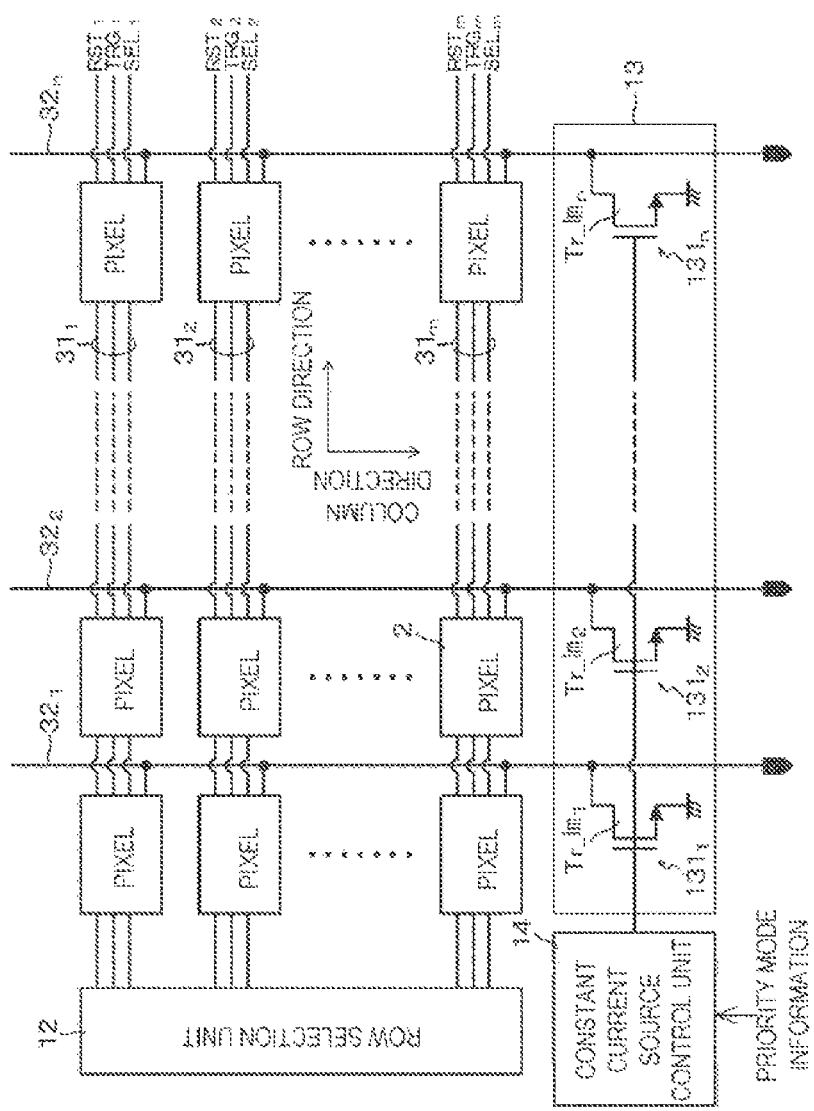
FIG. 2 is a circuit diagram illustrating basic circuit configuration of the constant current source circuit unit in the CMOS image sensor according to an embodiment of the present disclosure.

The constant current source circuit unit 13 basically includes a set of constant current sources $131_1$-$131_n$ (hereinafter sometimes collectively referred to as "constant current source 131") connected to the respective vertical signal lines $32_1$-$32_n$ for each pixel column, as illustrated in FIG. 2. The constant current sources $131_1$-$131_n$ are typically configured as, in one example, NMOS transistors $Tr\_lm_1$-$Tr\_lm_n$, which are called load MOS. The constant current source circuit unit 13 supplies a bias current to each pixel 2 in the pixel row that is selectively scanned by the row selection unit 12 through the respective vertical signal lines 32. The technology of the present disclosure is applied to the constant current source circuit unit 13 (detailed description thereof will be given later).

The analog-to-digital (A/D) conversion unit 15 includes a set of a plurality of analog-to-digital converters provided in association with each of the vertical signal lines $32_1$-$32_n$, and converts an analog pixel signal output for each pixel column into a digital signal. The analog-to-digital converter is capable of employing a well-known analog-to-digital converter. Specifically, the analog-to-digital converter is capable of employing, as one example, a single-slope analog-to-digital converter, a successive approximation analog-to-digital converter, or a delta-sigma ($\Delta\Sigma$) analog-to-digital converter. However, the analog-to-digital converter is not limited to these examples.

The storage unit 16 stores an analog-to-digital conversion result of the analog-to-digital conversion unit 15 through processing in the data processing unit 17.

The data processing unit 17 is a digital signal processing unit that processes a digital signal output from the analog-to-digital conversion unit 15. The data processing unit 17 performs processing of writing or reading an analog-to-digital conversion result to or from the storage unit 16, or performs various types of processing on the analog-digital conversion result.

The output unit 18 outputs a signal processed in the data processing unit 17. The timing control unit 19 generates various types of timing signals, clock signals, control signals, or the like, and performs drive control on the row selection unit 12, the constant current source control unit 14, the analog-to-digital conversion unit 15, the data processing unit 17, or the like on the basis of these generated signals.

[Circuit Configuration of Unit Pixel]

Figure 3:
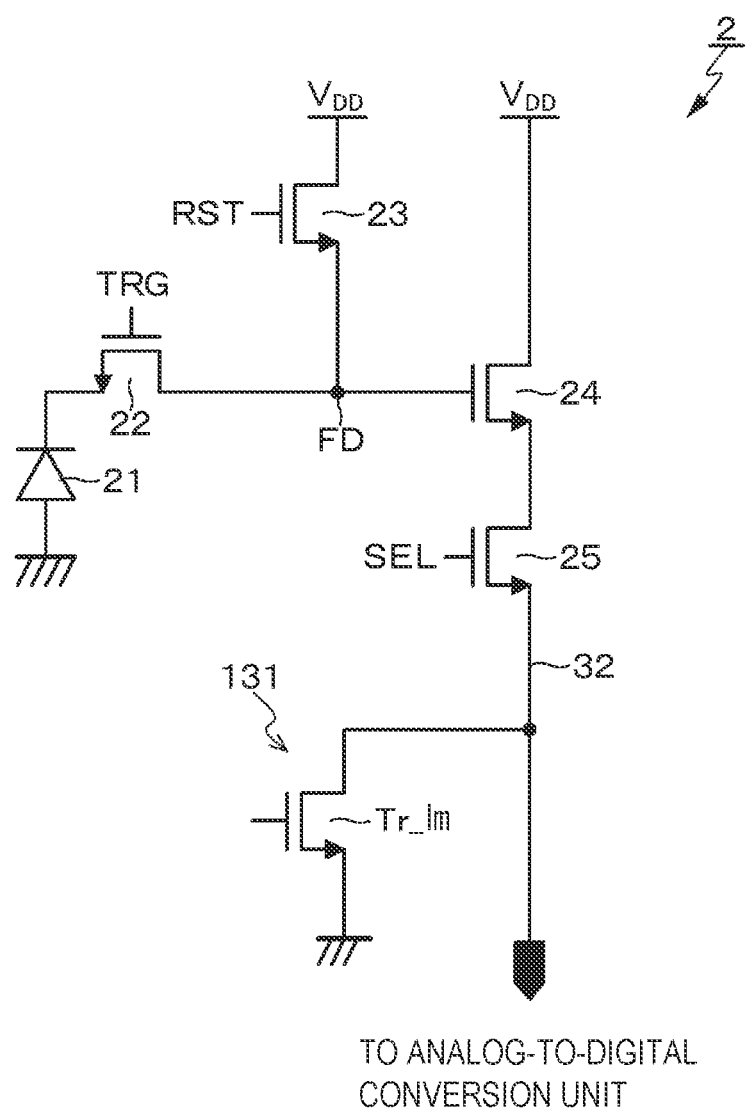
FIG. 3 is a circuit diagram illustrating one embodiment of a circuit configuration of a unit pixel in a CMOS image sensor according to an embodiment of the present disclosure.

FIG. 3 is a circuit diagram illustrating one example of circuit configuration in the unit pixel 2. The unit pixel 2 includes, in one example, a photodiode 21 as a photoelectric conversion unit. The unit pixel 2 has pixel configuration including, in addition to the photodiode 21, a transfer transistor 22, a reset transistor 23, an amplification transistor 24, and a selection transistor 25.

Moreover, in this description, four transistors of the transfer transistor 22, the reset transistor 23, the amplification transistor 24, and the selection transistor 25 employ, in one example, an N-channel MOSFET. However, the combination of conductivity types of these four transistors 22 to 25 illustrated in this example is merely an example, and is not limited to such combination.

In this unit pixel 2, a plurality of pixel drive lines used as the pixel drive lines $31_1$-$31_m$ described above is wired in common to the respective pixels 2 in the same pixel row. These plurality of pixel drive lines is connected to the output ends corresponding to each pixel row of the row selection unit 12 in units of pixel rows. The row selection unit 12 outputs a transfer signal TRG, a reset signal RST, and a selection signal SEL appropriately to the plurality of pixel drive lines.

The photodiode 21 has an anode electrode connected to a low-potential-side power supply (e.g., ground). The photodiode 21 performs photoelectrical conversion on the received light into photoelectric charge (in this example, photoelectrons) of a charge amount corresponding to the light amount, and accumulates the photoelectric charge. The cathode electrode of the photodiode 21 is electrically connected to a gate electrode of the amplification transistor 24 via the transfer transistor 22. In this description, the region where the gate electrode of the amplification transistor 24 is electrically connected is a floating diffusion (floating diffusion region or impurity diffusion region) FD. The floating diffusion FD is a charge-voltage conversion unit that converts electric charge into voltage.

The transfer signal TRG that is in an active state at high level (e.g., VDD level) is applied from the row selection unit 12 to a gate electrode of the transfer transistor 22. The transfer transistor 22 is made to the conduction state in response to the transfer signal TRG, thereby transferring the photoelectric charge, which obtained by photoelectrical conversion in the photodiode 21 and accumulated in the photodiode 21, to the floating diffusion FD.

The reset transistor 23 is connected between the node of a high-potential-side power supply $V_{DD}$ and the floating diffusion FD. The reset signal RST that is in an active state at high level is supplied from the row selection unit 12 to a gate electrode of the reset transistor 23. The reset transistor 23 is made to the conduction state in response to the reset signal RST, thereby resetting the floating diffusion FD by sweeping out electric charge of the floating diffusion FD to the node of the voltage $V_{DD}$.

The amplification transistor 24 has the gate electrode connected to the floating diffusion FD and a drain electrode connected to the node of the high-potential-side power supply $V_{DD}$. The amplification transistor 24 acts as an input port of a source follower that reads out a signal obtained by photoelectric conversion at the photodiode 21. In other words, the amplification transistor 24 has a source electrode connected to the vertical signal line 32 via the selection transistor 25. In addition, the amplification transistor 24 and the constant current source $131_1$-$131_n$ connected to one end of the vertical signal line 32, for example the NMOS transistors Tr_lm$_1$-Tr_lm$_n$ constitute a source follower circuit that converts the signal voltage of the floating diffusion FD into the potential of the vertical signal line 32.

The selection transistor 25 has, in one example, a drain electrode connected to the source electrode of the amplification transistor 24 and a source electrode connected to the vertical signal line 32. The selection signal SEL that is in an active state at high level is applied from the row selection unit 12 to a gate electrode of the selection transistor 25. The selection transistor 25 is made to the conduction state in response to the selection signal SEL, and so the state of the unit pixel 2 is made to the selected stat and the signal output from the amplification transistor 24 is transferred to the vertical signal line 32.

Moreover, the selection transistor 25 is capable of being configured as a circuit connected between the node of the high-potential-side power supply $V_{DD}$ and the drain electrode of the amplification transistor 24. In addition, this example exemplifies, as a pixel circuit of the unit pixel 2, the 4-Tr configuration including the transfer transistor 22, the reset transistor 23, the amplification transistor 24, and the selection transistor 25, that is, four transistors (Trs), but it is not limited to this example. In one example, the 3-Tr configuration in which the selection transistor 25 is omitted and the amplification transistor 24 has the function of the selection transistor 25 may be provided, or the configuration of 5-Tr or more in which the number of transistors is increased may be provided as necessary.

[Circuit Operation of Unit Pixel]

Figure 4:
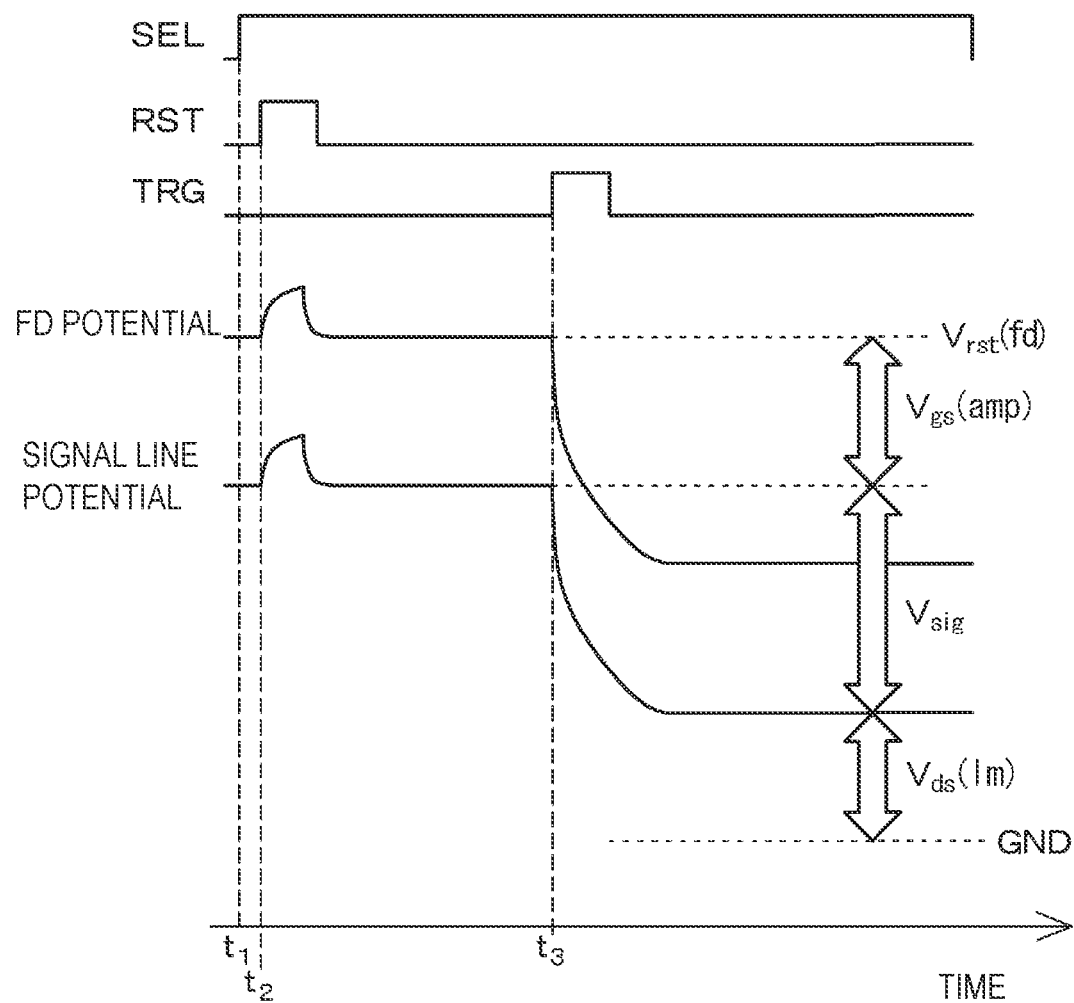
FIG. 4 is a timing waveform diagram illustrated to describe a circuit operation of a unit pixel.

A circuit operation of reading out the pixel signal from the unit pixel 2 having the above-described configuration is now described with reference to the timing waveform diagram of FIG. 4.

At time $t_1$, the selection signal SEL is made to the active state (high level) and the selection transistor 25 is turned on, so the pixel 2 is selected in units of pixel rows and the selected pixel 2 is connected to the vertical signal line 32.

Then, at time $t_2$, the reset signal RST is made to the active state and the reset transistor 23 is turned on, so the floating diffusion FD is reset.

Then, at time $t_3$, the transfer signal TRG is made to the active state and the transfer transistor 22 is turned on, so the charge accumulated in the photodiode 21 is transferred to the floating diffusion FD. This transferred charge is converted into a voltage signal in the floating diffusion FD. The amplification transistor 24 buffers the potential of the floating diffusion FD and reads out it to the vertical signal line 32 ($32_1$-$32_n$) through the selection transistor 25.

In this description, the source follower circuit, which includes the amplification transistor 24 of the unit pixel 2 and the constant current source 131 configured as the NMOS transistor Tr_lm, is provided for each pixel column. This arrangement allows the pixel signal output from the unit pixel 2 to be read out in column parallel by the source follower circuit. In addition, a variation between the potential after resetting the floating diffusion FD and the potential after transferring the signal charge appears reliably on the vertical signal line 32.

The potential of the floating diffusion FD, when being reset by the reset transistor 23, that is, the reset level is $V_{rst}$(fd). An effective signal level $V_{sig}$ is obtained by removing the gate-source voltage $V_{gs}$(amp) of the amplification transistor 24 and the drain-source voltage $V_{ds}$(lm) of the NMOS transistor Tr_lm that constitutes the constant current source 131 from the reset level $V_{rst}$(fd).

As described above, in the CMOS image sensor 1 in which the unit pixels 2 having the above-described configuration are two-dimensionally arranged, the source follower circuit including the amplification transistor 24 of the unit pixel 2 and the NMOS transistor Tr_lm is provided for each pixel column. This arrangement allows the pixel signal output from the unit pixel 2 to be read out in column parallel by the source follower circuit. In other words, the CMOS image sensor 1 according to the present embodiment achieves a high frame rate by reading out the pixel signal in column parallel from the respective unit pixels 2.

[Stacked Structure]

Figure 5:
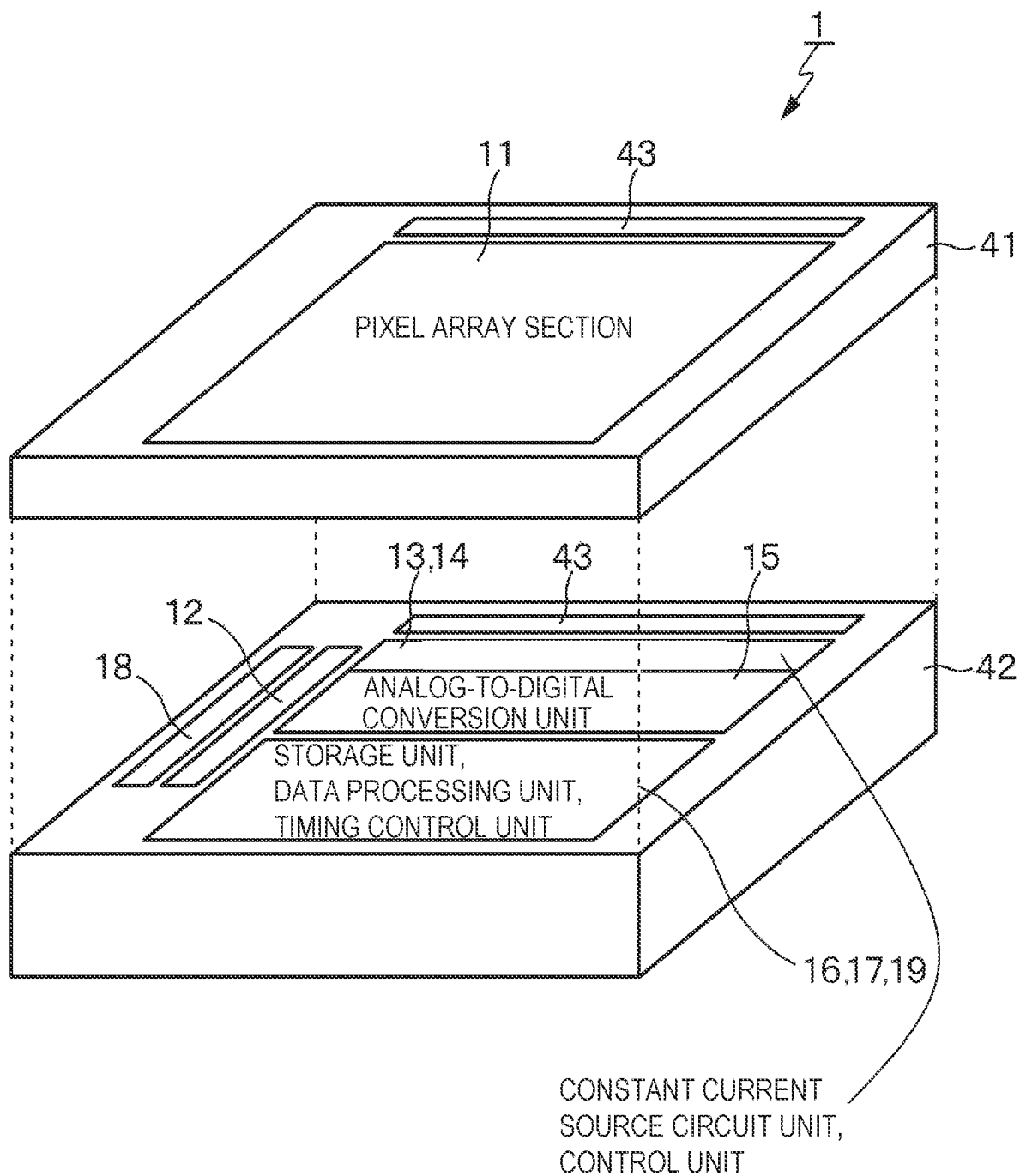
FIG. 5 is an exploded perspective view schematically illustrating a stacked structure of a CMOS image sensor according to an embodiment of the present disclosure.

The CMOS image sensor 1 having the above-described configuration is capable of employing, what is called, a stacked structure image sensor in which at least two semiconductor substrates (chips) of a first semiconductor substrate 41 and a second semiconductor substrate 42 are arranged on top of each other as illustrated in FIG. 5. In addition, the CMOS image sensor 1 according to the present example is capable of having a backside illumination pixel structure in which, assuming that the substrate side on which the wiring layer is disposed is the front surface (front side), the light emitted from the back side on the opposite side is captured.

In the CMOS image sensor 1 having the stacked structure, the pixel array section 11 in which the unit pixels 2 having a backside illumination pixel structure are arranged in a matrix is formed on the first semiconductor substrate 41 as a first layer. In addition, the circuitry components including the row selection unit 12, the constant current source circuit unit 13, the constant current source control unit 14, the analog-to-digital conversion unit 15, the storage unit 16, the data processing unit 17, the output unit 18, the timing control unit 19, and the like are formed on the second semiconductor substrate 42 as a second layer. Then, the first semiconductor substrate 41 as the first layer and the second semiconductor substrate 42 as the second layer are electrically connected to each other through a via (VIA) 43.

The use of the CMOS image sensor 1 having this stacked structure enables the first semiconductor substrate 41 to have a size (area) sufficient only to dispose the pixel array section 11, thereby reducing the size (area) of the first semiconductor substrate 41 as the first layer and eventually the size of the entire chip. Furthermore, the process suitable for manufacturing the unit pixel 2 is applicable to the first semiconductor substrate 41 as the first layer, and the process suitable for manufacturing circuitry portions is applicable to the second semiconductor substrate 42 as the second layer, thereby providing an advantage that process optimization in manufacturing the CMOS image sensor 1 is achievable.

Moreover, this example illustrates a two-layer stacked structure in which the first semiconductor substrate 41 and the second semiconductor substrate 42 are arranged on top of each other, but the stacked structure is not limited to the two-layer structure, and a structure having three or more layers can be used. Further, in a case of employing a stacked structure of three or more layers, the circuitry portions including the row selection unit 12, the constant current source circuit unit 13, the constant current source control unit 14, the analog-to-digital conversion unit 15, the storage unit 16, the data processing unit 17, the output unit 18, the timing control unit 19, or the like can be disposed in a distributed manner on the second and subsequent semiconductor substrates.

Further, the above example describes the case where the technology according to the present disclosure is applied to the stacked structure CMOS image sensor 1, but it is not limited to the application to the stacked structure CMOS image sensor 1. In other words, the technology according to the present disclosure is applicable to, what is called, a flat structure CMOS image sensor in which the circuitry portions including the row selection unit 12, the constant current source circuit unit 13, the constant current source control unit 14, the analog-to-digital conversion unit 15, the storage unit 16, the data processing unit 17, the output unit 18, the timing control unit 19, or the like on the same semiconductor substrate as the pixel array section 11.

[Technique in Related Art Regarding Increased Dynamic Range]

Meanwhile, in a solid-state image sensor such as a CMOS image sensor, there is a technique that makes the conversion efficiency (conversion efficiency between charge and voltage) of the floating diffusion FD variable as a technique for achieving an increased dynamic range (Patent Documents 1 and 2). This technique necessitates a transistor for switching the conversion efficiency and a large capacitor for achieving the low conversion efficiency, so it is necessary to prepare a region for providing such a transistor or large capacitor, resulting in lowering of the aperture ratio of the unit pixel 2.

DESCRIPTION OF EMBODIMENT

In view of this, in the CMOS image sensor 1 having the above-described configuration, the technology of the present disclosure is applied to the constant current source 131 of the constant current source circuit unit 13 to achieve an increased dynamic range without lowering of the aperture ratio of the unit pixel 2. In applying the technology of the present disclosure to the constant current source 131, the NMOS transistor Tr_lm (hereinafter referred to as "load MOS") that constitutes the current source 131 is considered.

The relational expressions relating to the input voltage range and noise of the load MOS are given as follows.

$$V_N(LM) = I_N(LM) \times Z_0 \quad (1)$$

$$Z_0 = R_{VSL} + 1/Gm(PX) \quad (2)$$

$$I_N(LM) \approx k_B \times T \times Gm(LM) \quad (3)$$

$$Gm(LM) \approx I_{col}/\sqrt{V_{od}(LM)} \quad (4)$$

In Expression (1), $V_N(LM)$ is voltage noise caused by the load MOS, $I_N(LM)$ is current noise caused by the load MOS, and $Z_0$ is the output impedance measured from the drain node of the load MOS. As shown in Expression (1), the voltage noise $V_N(LM)$ caused by the load MOS is obtained from the product of the current noise $I_N(LM)$ and the output impedance $Z_0$.

In Expression (2), $R_{VSL}$ is the wiring resistance of the vertical signal line 32, and Gm(PX) is the transconductance of the unit pixel 2. As shown in Expression (2), the output impedance $Z_0$ measured from the drain node of the load MOS is obtained from the sum of the wiring resistance $R_{VSL}$ of the vertical signal line 32 and the reciprocal of the transconductance Gm(PX) of the unit pixel 2.

In a large solid-state image sensor such as 35 mm full size or advanced photo system type-C (APS-C) size, the wiring length of the vertical signal line 32 from the unit pixel 2 to the load MOS is long. In addition, with the increase in the number of pixels of the solid-state image sensor, the pitch of the unit pixels 2 is narrowed, so the vertical signal line 32 is necessary to be made thin to prevent the chip size from being increased. Accordingly, the wiring resistance $R_{VSL}$ of the vertical signal line 32 is increased, and the current noise $I_N(LM)$ caused by the load MOS is converted into the large voltage noise $V_N(LM)$.

In Expression (3), kB is the Boltzmann constant, T is the temperature, and Gm(LM) is the transconductance of the load MOS. As shown in Expression (3), the current noise $I_N(LM)$ caused by the load MOS is obtained from the product of the Boltzmann constant $k_B$, the temperature T, and the transconductance Gm(LM) of the load MOS. It is necessary to reduce the transconductance Gm(LM) of the load MOS to keep the current noise $I_N(LM)$ caused by the load MOS small.

In Expression (4), $I_{col}$ is the current of the readout circuit including the load MOS, that is, the column current flowing in the vertical signal line 32, and $V_{od}(LM)$ is the overdrive voltage of the load MOS. As shown in Expression (4), the transconductance Gm(LM) of the load MOS is obtained from the column current $I_{col}$ and the overdrive voltage $V_{od}(LM)$ of the load MOS.

In this description, it is necessary to set the column current $I_{col}$ of the readout circuit to a current value greater than or equal to a predetermined value to ensure the settling characteristics of the vertical signal line 32. Thus, the reduction of the column current $I_{col}$ is difficult to lead the reduction in the transconductance Gm(LM) of the load MOS, that is, lowering of the current noise $I_N(LM)$ caused by the load MOS.

As is apparent from Expression (4), the transconductance Gm(LM) of the load MOS is capable of being adjusted by using the overdrive voltage $V_{od}(LM)$ of the load MOS. However, keeping the load MOS in the saturation region necessitates keeping the drain-source voltage $V_{ds}(LM)$ of the load MOS equal to or higher than the overdrive voltage $V_{od}(LM)$. Thus, the increase in the overdrive voltage $V_{od}$ (LM) of the load MOS necessarily causes drain-source voltage $V_{ds}(LM)$ to increase, which limits the input voltage range of the read circuit.

In this way, the noise caused by the load MOS and the input voltage range of the readout circuit (corresponding to $V_{sig}$ in FIG. 4) also have the trade-off relationship, and so it is difficult to satisfy both the noise characteristics and range characteristics at the same time.

Thus, in the present embodiment, the constant current source 131 of the constant current source circuit unit 13 includes a plurality of transistors, and it is possible to select the size or number of the plurality of transistors that constitutes the constant current source 131 or a configuration using the connection method of the plurality of transistors (e.g., serial connection or parallel connection). In this description, in the constant current source 131 using a selected configuration, a plurality of transistors that constitutes the constant current source 131 can be regarded as one transistor in which the gate width W and the gate length L are equivalent to each other. In addition, the overdrive voltage $V_{od}(LM)$ of the load MOS can be represented by Expression (5) below.

$$V_{od}(LM) \approx \sqrt{I_{col}} / \sqrt{W/L} \qquad (5)$$

As shown in Expression (5), the overdrive voltage $V_{od}(LM)$ of the load MOS can be obtained from the column current $I_{col}$ of the readout circuit and a ratio between the gate width W and the gate length L of the equivalent transistor of the constant current source 131 (Hereinafter, it is described as "equivalent W/L"). Thus, in the present embodiment, in the case where the plurality of transistors that constitutes the constant current source 131 is regarded as one transistor in which the gate width W and the gate length L are equivalent to each other, the ratio between the gate width W and the gate length L of the plurality of transistors, that is, the equivalent W/L is switched on the basis of the illumination in the image-capturing environment.

In one example, the equivalent W/L is switched depending on the magnitude (high or low) of the illumination in the image-capturing environment, that is, whether the low-illumination environment or the high-illumination environment. Specifically, upon image-capturing in the high-illumination environment, a configuration with a large equivalent W/L is selected to minimize the overdrive voltage $V_{od}(LM)$ necessary for the load MOS. In addition, upon image-capturing in the low-illumination environment, a configuration with a small equivalent W/L is selected to make the overdrive voltage $V_{od}(LM)$ necessary for the load MOS large. This makes it possible for the noise caused by the load MOS to be reduced in accordance with Expressions (1) to (4).

As described above, the switching of the equivalent W/L between the low-illumination environment and the high-illumination environment in the case where a plurality of transistors that constitutes the constant current source 131 is regarded as one transistor in which the gate width W and the gate length L are equivalent to each other makes it possible to satisfy the opposing requirements of the increase in the input voltage range and the reduction of noise. In addition, even in the situation where the necessity for power supply voltage reduction is kept for achieving the refinement or power saving in the device process, it is possible to increase the dynamic range without lowering of the aperture ratio of the unit pixel 2.

In switching the equivalent W/L of a plurality of transistors that constitutes the constant current source 131 between the low-illumination environment and the high-illumination environment, it is preferable that the priority modes of the noise priority mode and the range priority mode can be optionally set. The noise priority mode is a mode in which priority is given to an operation of reading out a pixel signal from the unit pixel 2 with low noise. The range priority mode is a mode in which priority is given to the operation of increasing the input voltage range.

The switching of the equivalent W/L of the plurality of transistors that constitutes the constant current source 131 is executed under the control of the constant current source control unit 14. In other words, the constant current source control unit 14 performs the switching of the equivalent W/L by switching the connection state between the plurality of transistors that constitutes the constant current source 131 and by switching the setting of the gate bias voltage of the plurality of transistors on the basis of mode information of the priority mode to be set. More specifically, the constant current source control unit 14 performs control to relatively increase the equivalent W/L upon setting the range priority mode and relatively decrease the equivalent W/L upon setting the noise priority mode.

As described above, according to the present embodiment, it is possible to achieve the optimization of input voltage range and noise by using the constant current source 131 configured as the load MOS without changing the circuit configuration or layout on the side of the unit pixel 2. Thus, it is possible to achieve the increased dynamic range without lowering of the aperture ratio or characteristics of the unit pixel 2. In one example, in the 90 nm process at 3 V power supply voltage, the range priority mode can increase the input voltage range by about 400 mV as compared to the noise priority mode. On the other hand, it is ascertained that the noise priority mode can reduce the size of the load MOS by half as compared to the range priority mode. It is also possible to further increase the dynamic range by a synergistic effect obtained by combining it with the technique in the related art for increasing the dynamic range on the side of the unit pixel 2.

Specific examples of the present embodiment are now described for switching the equivalent W/L of the plurality of transistors depending on the magnitude of the illumination in the image-capturing environment in the case where the plurality of transistors that constitutes the constant current source 131 is regarded as one transistor in which the gate width W and the gate length L are equivalent to each other.

First Example

Figure 6A:
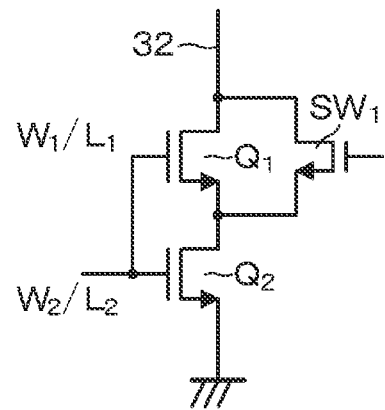
FIG. 6A is a diagram illustrating a circuit configuration of a constant current source according to a first embodiment.
Figure 6B:
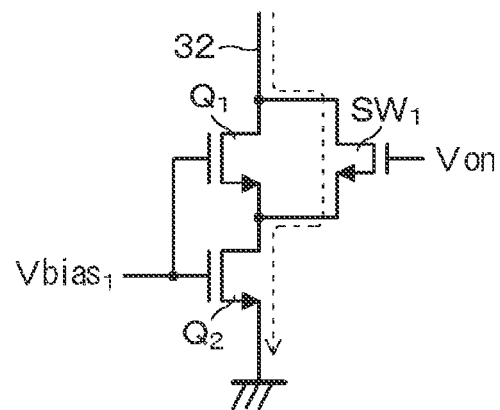
FIG. 6B is a diagram illustrating an operation example upon setting a range priority mode.
Figure 6C:
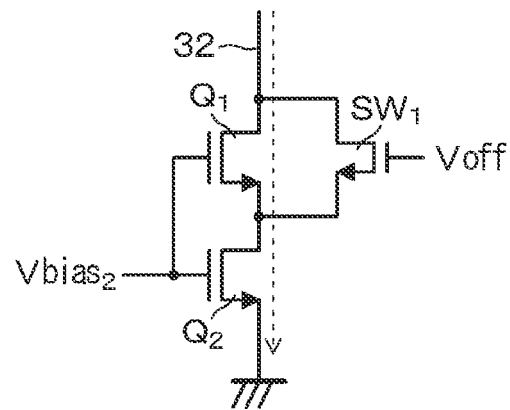
FIG. 6C is a diagram illustrating an operation example upon setting a noise priority mode.

A first example is an example in which, as the constant current source 131, two NMOS transistors $Q_1$ and $Q_2$ are arranged one on top of the other in the vertical direction, that is, are connected in series. FIG. 6A illustrates a circuit configuration of the constant current source 131 according to the first example. In addition, an operation example upon setting the range priority mode of the constant current source 131 according to the first example is illustrated in FIG. 6B, and an operation example upon setting the noise priority mode thereof is illustrated in FIG. 6C. In FIGS. 6B and 6C, a dotted line depicts a path through which current flows.

As illustrated in FIG. 6A, the constant current source 131 according to the first example has two NMOS transistors $Q_1$ and $Q_2$ connected in series between the vertical signal line 32 and a reference potential (e.g., ground) node, and the gate electrodes thereof are connected in common. The ratio between the gate width W and the gate length L of the transistor $Q_1$ is $W_1/L_1$, and the ratio between the gate width W and the gate length L of the transistor $Q_2$ is $W_2/L_2$. In addition, in one example, the transistor $Q_1$ on the side of the vertical signal line 32 of the two transistors $Q_1$ and $Q_2$ is connected in parallel with a switch element $SW_1$ configured as, for example, an NMOS transistor.

The constant current source control unit 14 performs a control operation described below on the constant current source 131 according to the first example having the above-described configuration. In other words, upon image-capturing in the high-illumination environment, that is, upon setting the range priority mode, as illustrated in FIG. 6B, a predetermined gate bias voltage $Vbias_1$ is applied to the two transistors $Q_1$ and $Q_2$. In addition, a high gate voltage Von is applied to the gate of the switch element $SW_1$ to turn on the switch element $SW_1$ and the drain-source of the transistor $Q_1$ is short-circuited. Thus, the constant current source 131 has a configuration in which only the transistor $Q_2$ is enabled.

Upon image-capturing in the low-illumination environment, that is, upon setting the noise priority mode, a predetermined gate bias voltage $Vbias_2$ is applied to the two transistors $Q_1$ and $Q_2$ as illustrated in FIG. 6C. In addition, a low gate voltage Voff is applied to the gate of the switch element $SW_1$ to turn off the switch element $SW_1$ and the transistor $Q_1$ is enabled. Thus, it is possible to regard the constant current source 131 as a transistor having a small equivalent W/L in which the transistor $Q_1$ and the transistor $Q_2$ are connected in series.

In this example, the switch element $SW_1$ is connected in parallel to the transistor $Q_1$ on the side of the vertical signal line 32 of the two transistors $Q_1$ and $Q_2$, but it is also possible to employ a circuit configuration of connecting the switch element $SW_1$ to the transistor $Q_2$ on the ground side and performing on-or-off control of the switch element $SW_1$.

In the constant current source 131 according to the first example having the above-described configuration, it is necessary to use a transistor having large size as the transistors $Q_1$ and $Q_2$ in consideration of analog characteristics such as 1/f or random telegraph noise (RTN). On the other hand, the switch element $SW_1$ is used only for on-or-off control, and so a small-sized transistor is sufficient.

As described above, the effective use of the transistors $Q_1$ and $Q_2$ having a large area between different configurations (i.e., between the configurations of FIGS. 6B and 6C) by using the switch element $SW_1$ having a small size makes it possible to increase the mounting area efficiency of the constant current source 131. In addition, even in the constant current source 131 provided for each pixel column, it is possible to prevent the circuit area for accommodating a plurality of configurations from being increased.

Second Example

Figure 7A:
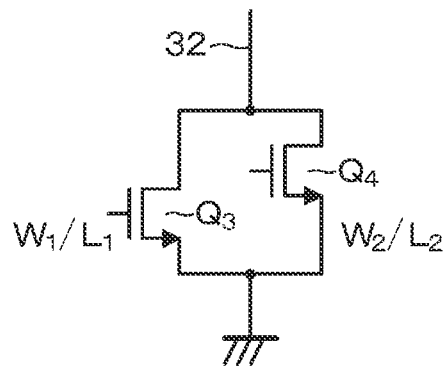
FIG. 7A is a diagram illustrating a circuit configuration of a constant current source according to a second example.
Figure 7B:
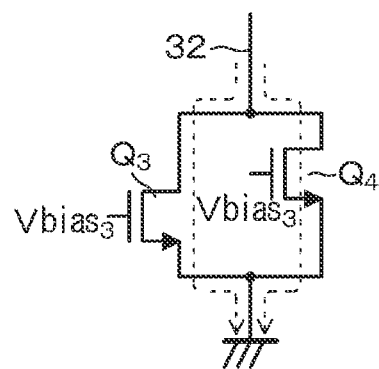
FIG. 7B is a diagram illustrating an operation example upon setting a range priority mode.
Figure 7C:
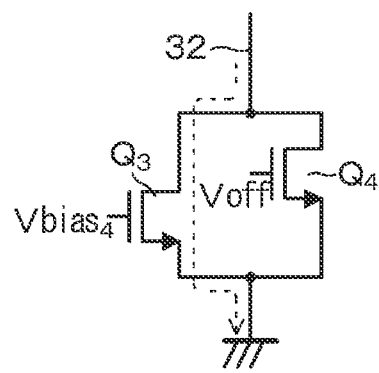
FIG. 7C is a diagram illustrating an operation example upon setting a noise priority mode.

A second example is an example in which, as the constant current source 131, two NMOS transistors $Q_3$ and $Q_4$ are connected in parallel. FIG. 7A illustrates a circuit configuration of the constant current source 131 according to the second example. In addition, an operation example upon setting the range priority mode of the constant current source 131 according to the second example is illustrated in FIG. 7B, and an operation example upon setting the noise priority mode thereof is illustrated in FIG. 7C. In FIGS. 7B and 7C, a dotted line depicts a path through which current flows.

As illustrated in FIG. 7A, the constant current source 131 according to the second example has two NMOS transistors $Q_3$ and $Q_4$ connected in series between the vertical signal line 32 and a reference potential (e.g., ground) node. The ratio between the gate width W and the gate length L of the transistor $Q_3$ is $W_1/L_1$, and the ratio between the gate width W and the gate length L of the transistor $Q_4$ is $W_2/L_2$.

The constant current source control unit 14 performs a control operation described below on the constant current source 131 according to the second example having the above-described configuration. In other words, upon image-capturing in the high-illumination environment, that is, upon setting the range priority mode, as illustrated in FIG. 7B, a predetermined gate bias voltage $Vbias_3$ is applied to the two transistors $Q_3$ and $Q_4$, and both transistors $Q_3$ and $Q_4$ are enabled. Thus, it is possible to regard the constant current source 131 as a transistor having a large equivalent W/L in which the transistor $Q_3$ and the transistor $Q_4$ are connected in parallel.

Upon image-capturing in the low-illumination environment, that is, upon setting the noise priority mode, as illustrated in FIG. 7C, a predetermined gate bias voltage $Vbias_4$ is applied to the gate of one transistor $Q_3$ and a low gate voltage Voff is applied to the gate of the other transistor $Q_4$ to turn off the transistor $Q_4$. Thus, the constant current source 131 has a configuration in which only one transistor $Q_3$ is enabled.

Third Example

Figure 8A:
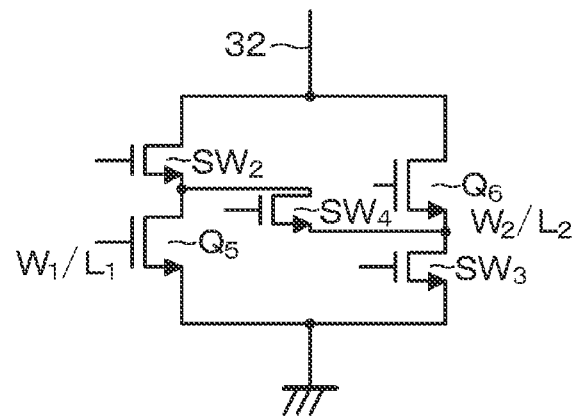
FIG. 8A is a diagram illustrating a circuit configuration of a constant current source according to a third example.
Figure 8B:
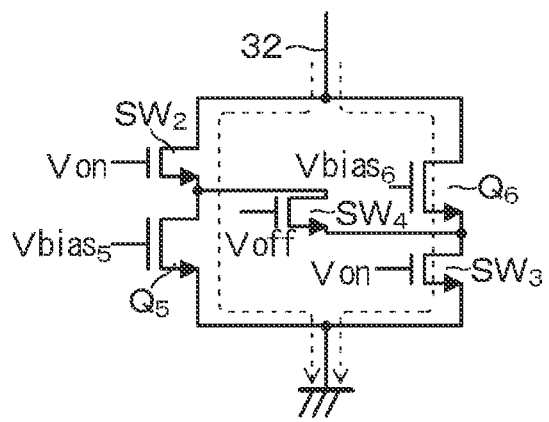
FIG. 8B is a diagram illustrating an operation example upon setting a range priority mode.
Figure 8C:
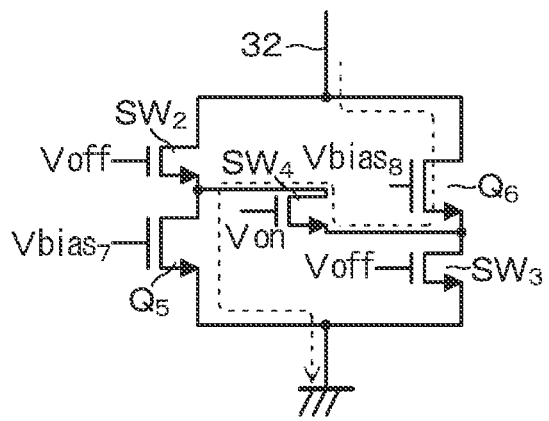
FIG. 8C is a diagram illustrating an operation example upon setting a noise priority mode.

A third example is an example of a combination of the first example and the second example. FIG. 8A illustrates a circuit configuration of the constant current source 131 according to the third example. In addition, an operation example upon setting the range priority mode of the constant current source 131 according to the third example is illustrated in FIG. 8B, and an operation example upon setting the noise priority mode thereof is illustrated in FIG. 8C. In FIGS. 8B and 8C, a dotted line depicts a path through which current flows.

As illustrated in FIG. 8A, the constant current source 131 according to the second example includes two NMOS transistors $Q_5$ and $Q_6$ and three switch elements $SW_2$, $SW_3$, and $SW_4$ configured as, for example, an NMOS transistor. The ratio between the gate width W and the gate length L of the transistor $Q_5$ is $W_1/L_1$, and the ratio between the gate width W and the gate length L of the transistor $Q_6$ is $W_2/L_2$.

The switch element $SW_2$ and the transistor $Q_5$ are connected in series between the vertical signal line 32 and a reference potential (e.g., ground) node. Similarly, the transistor $Q_6$ and the switch element $SW_3$ are connected in series between the vertical signal line 32 and the reference potential node. The switch element $SW_4$ is connected between the connection node of the switch element $SW_2$ and the transistor $Q_5$ and the connection node of the transistor $Q_6$ and the switch element $SW_3$.

The constant current source control unit 14 performs a control operation described below on the constant current source 131 according to the third example having the above-described configuration. In other words, upon image-capturing in the high-illumination environment, that is, upon setting the range priority mode, as illustrated in FIG. 8B, a predetermined gate bias voltage $Vbias_5$ is applied to the transistor $Q_5$ and a predetermined gate bias voltage $Vbias_6$ is applied to the transistor $Q_6$. In addition, a high gate voltage Von is applied to each gate of the switch elements $SW_2$ and $SW_3$ to turn on the switch elements $SW_2$ and $SW_3$, and a low gate voltage Voff is applied to the gate of the switch element $SW_4$ to turn off the switch element $SW_4$.

Thus, the constant current source 131 has a configuration in which the transistor $Q_5$ and the transistor $Q_6$ are connected in parallel. This corresponds to the configuration of the connection state upon setting the range priority mode of the second example (FIG. 7B). In other words, it is possible to regard the constant current source 131 as a transistor having the large equivalent W/L in which the transistor $Q_5$ and the transistor $Q_6$ are connected in parallel.

Upon image-capturing in the low-illumination environment, that is, upon setting the noise priority mode, as illustrated in FIG. 8C, a predetermined gate bias voltage $Vbias_7$ is applied to the transistor $Q_5$ and a predetermined gate bias voltage $Vbias_8$ is applied to the transistor $Q_6$. In addition, a low gate voltage Voff is applied to each gate of the switch elements $SW_2$ and $SW_3$ to turn off the switch elements $SW_2$ and $SW_3$, and a high gate voltage Von is applied to the gate of the switch element $SW_4$ to turn on the switch element $SW_4$. Thus, the constant current source 131 has a configuration in which the transistor $Q_5$ and the transistor $Q_6$ are connected in series. This corresponds to the configuration of the connection state upon setting the noise priority mode of the second example (FIG. 7C).

The constant current source 131 according to the third example having the above-described configuration is similar to the constant current source 131 according to the first example. In other words, in the constant current source 131 according to the third example, it is necessary to use a large-sized transistor as the transistors $Q_5$ and $Q_6$ in consideration of analog characteristics such as 1/f or RT noise. On the other hand, the switch elements $SW_2$, $SW_3$, and $SW_4$ are only used for on-or-off control, and so small-sized transistors are sufficient.

As described above, the effective use of the transistors $Q_5$ and $Q_6$ having a large area between different configurations (i.e., between the configurations of FIGS. 8B and 8C) by using the switch elements $SW_2$, $SW_3$, and $SW_4$ having a small size makes it possible to increase the mounting area efficiency of the constant current source 131. In addition, even in the constant current source 131 provided for each pixel column, it is possible to prevent the circuit area for accommodating a plurality of configurations from being increased.

The above-mentioned first to third examples describe an exemplary circuit of the constant current source 131 that switches between two configurations corresponding to the case of performing image-capturing in the high-illumination environment and the case of performing image-capturing in the low-illumination environment, but a similar concept can be applied widely to the constant current source 131 capable of switching between three or more configurations.

Figure 9:
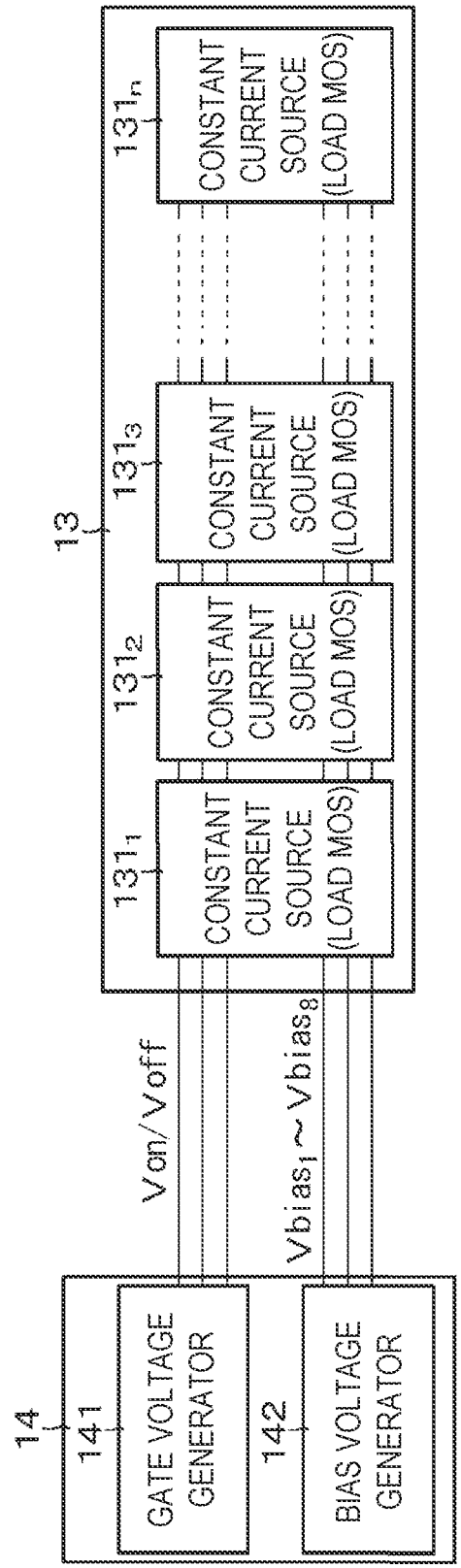
FIG. 9 is a block diagram illustrating an exemplary configuration of a constant current source control unit.

Moreover, the gate voltage (Von/Voff) used to perform on-or-off control of the switch elements $SW_1$ to $SW_4$ or the predetermined gate bias voltage ($Vbias_1$ to $Vbias_8$) for the transistors $Q_1$ to $Q_6$ are appropriately applied from the constant current source control unit 14. In other words, the constant current source control unit 14 includes a gate voltage generator 141 that generates the gate voltage (Von/Voff) and a bias voltage generator 142 that generates the gate bias voltages ($Vbias_1$ to $Vbias_8$) as illustrated in FIG. 9.

Fourth Example

Figure 10:
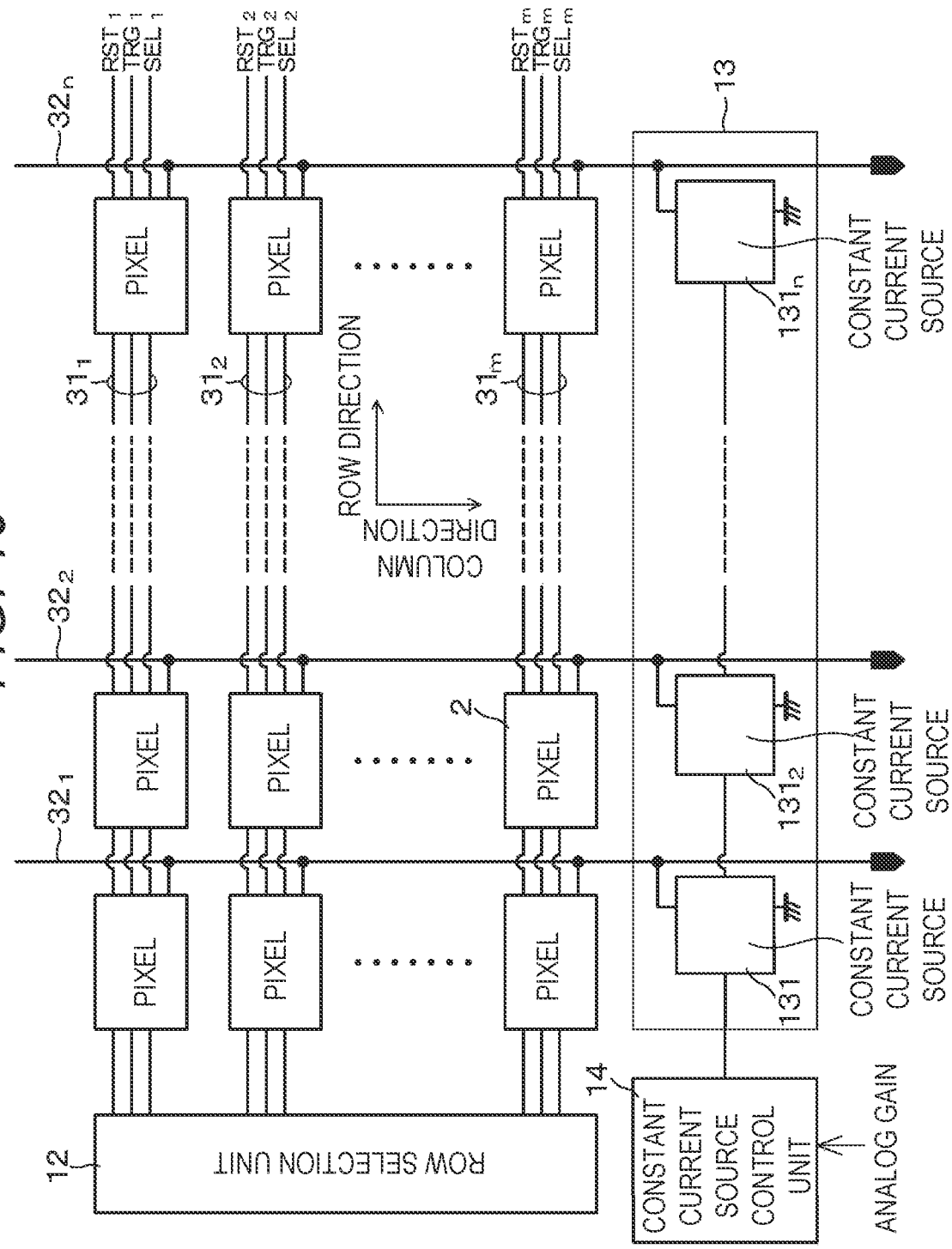
FIG. 10 is a block diagram schematically illustrating a configuration of a constant current source circuit unit according to a fourth example.

A fourth example is an example in which the optimization of the configuration of the constant current source 131 is associated correspondingly with the analog gain. FIG. 10 a block diagram schematically illustrating the configuration of the constant current source circuit unit 13 according to the fourth example.

The CMOS image sensor 1 provided with the constant current source circuit unit 13 according to the fourth example is capable of setting an analog gain for a pixel signal that is read out from the unit pixel 2 through the vertical signal line 32 in response to the determination by the user. The analog gain is the gain used in amplifying an analog pixel signal. The analog gain can be set in a plurality of stages in response to the determination by the user.

In the constant current source circuit unit 13 according to the fourth example, the constant current source control unit 14 switches the ratio (the equivalent W/L) between the gate width W and the gate length L of the plurality of transistors that constitutes the constant current source 131 depending on the analog gain to be set. The constant current source control unit 14 switches, in the case where the analog gain is switched in a plurality of stages, the equivalent W/L to a plurality of stages correspondingly.

The switching of the equivalent W/L is achievable by switching the connection state between the plurality of transistors that constitutes the constant current source 131 and by switching the setting of the gate bias voltage of the plurality of transistors, the concept of which is similar to that in the case of the first to third examples. In the case of the first to third examples, although the constant current source 131 has two configurations depending on the case of performing image-capturing in the high-illumination environment and the case of performing image-capturing in the low-illumination environment, a plurality of configurations i+1 corresponding to analog gain values AGs that are set in a plurality of stages is implementable as illustrated in FIG. 11.

FIG. 11 is a diagram illustrating a relationship between the analog gain value that is set in a plurality of stages and the configuration of the constant current source 131 in the fourth example. As is apparent from FIG. 11, the analog gain value and the priority mode are associated with each other. In other words, the case where the analog gain is low is associated with the range priority mode in which priority is given to the operation of increasing the input voltage range of the readout circuit including the constant current source circuit unit 13, and the case where the analog gain is high is associated with the noise priority mode in which priority is given to the operation of reading out a pixel signal from the unit pixel 2 with low noise.

As described above, in the fourth example, the optimization of the configuration of the constant current source 131 is associated correspondingly with the analog gain, that is, the equivalent W/L of the plurality of transistors that constitutes the constant current source 131 is switched depending on the analog gain to be set. This allows the optimization process of the input voltage range and noise to be performed seamlessly in the CMOS image sensor 1, which provides an advantage that control by the user is simplified.

Modification Example

Although the above-described embodiments describe the case where the technology of the present disclosure is applied to the CMOS image sensor in which unit pixels 2 are arranged in a matrix as an example, it is not limited to application to the CMOS image sensor. In other words, the technology of the present disclosure is applicable to all types of solid-state image sensors using the X-Y address method in which unit pixels 2 are two-dimensionally arranged in a matrix.

Further, the technology according to the present disclosure is not limited to application to a solid-state image sensor that detects the distribution of the amount of incident light of visible light and captures it as an image. The technology of the present disclosure is applicable to all types of solid-state image sensor that captures the distribution of incident amounts of infrared rays, X-rays, particles, or the like as an image.

Application example

Figure 12:
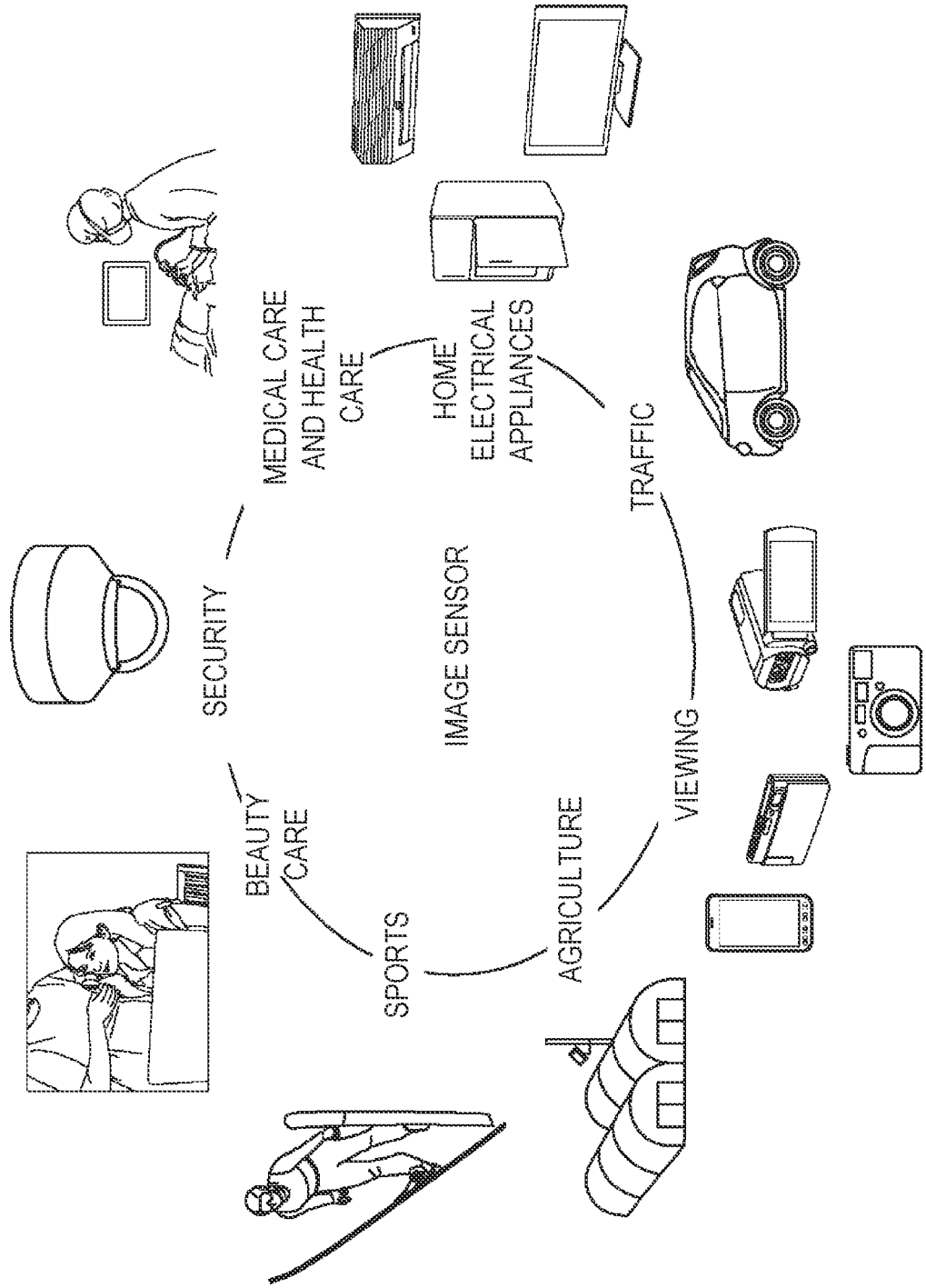
FIG. 12 is a diagram illustrating an applied example of technology according to the present disclosure.

The CMOS image sensor 1 according to the present embodiment described above is capable of being used for various devices for sensing light such as visible light, infrared light, ultraviolet light, and X-ray as illustrated, in one example, in FIG. 12. Specific examples of various devices are listed below.
- Devices used to capture images for appreciation, such as digital cameras and portable equipment provided with camera function
- Devices used for traffic, such as in-vehicle sensors that captures images of the front, rear, surroundings, interior, or the like of vehicles for safe driving including automatic stop and recognition of the driver's condition, monitoring cameras for monitoring traveling vehicles and roads, and ranging sensors that measure distance between vehicles
- Devices used for home appliances, such as TVs, refrigerators, and air conditioners, for capturing images of user's gestures and performing device operations in accordance with the gestures
- Devices used for medical and healthcare, such as endoscopes and instruments that perform angiography by receiving infrared light
- Devices used for security, such as security surveillance cameras and personal authentication cameras
- Devices used for beauty, such as skin measuring instruments for capturing images of skin and microscopes for capturing images of scalp
- Devices used for sports, such as action cameras and wearable cameras for sports application
- Devices used for agriculture, such as cameras for monitoring condition of farms or crops <Applied Example of Technology According to Present Disclosure>

The technology according to the present disclosure is applicable to various products. The description of more specific applied examples is now given.

[Electronic Apparatus of Present Disclosure]

The description is now given of a case where the present invention is applied to an electronic apparatus including an image-capturing device such as digital still cameras or video cameras, a portable terminal device provided with an image-capturing function such as mobile phones, or a copying machine using a solid-state image sensor for an image readout unit.

(Image-Capturing Device)

Figure 13:
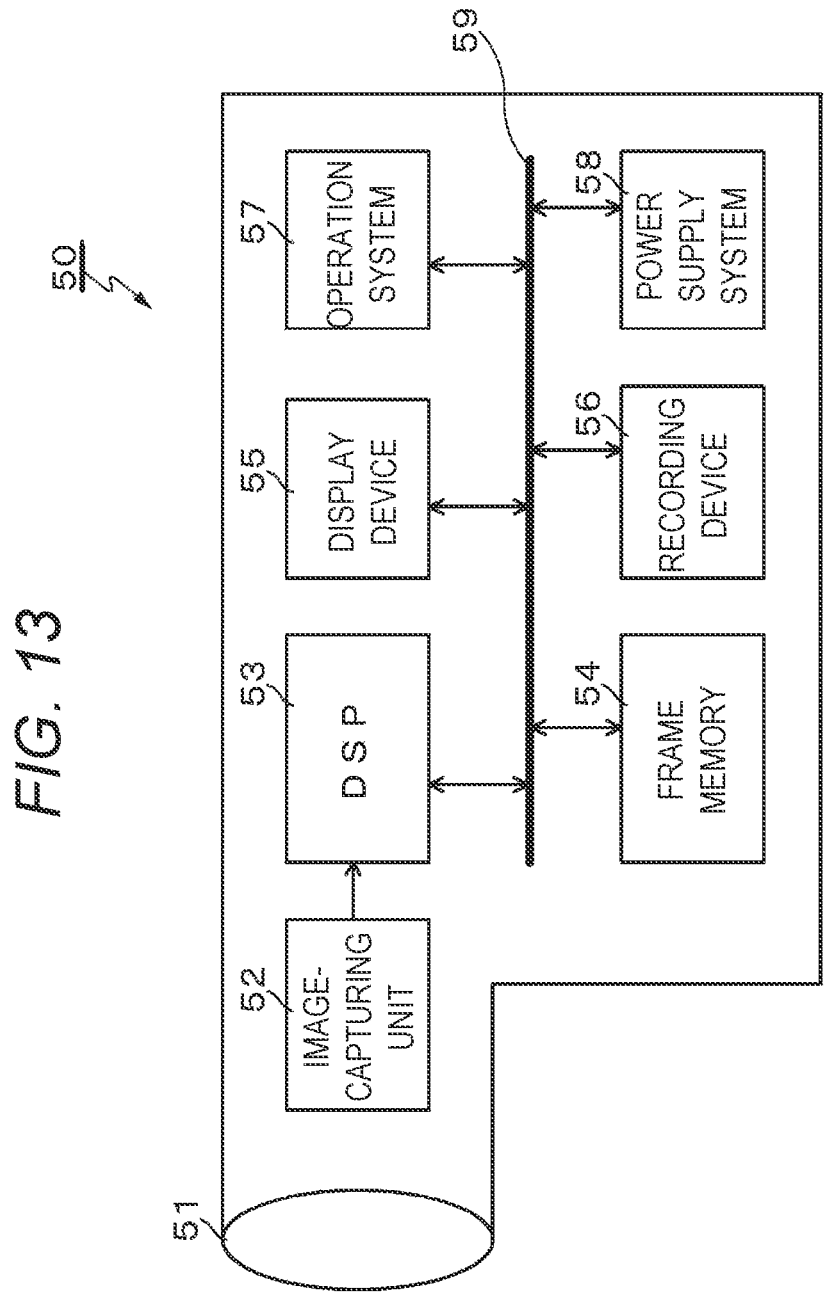
FIG. 13 is a block diagram illustrating configuration of an image-capturing device that is an example of the electronic apparatus of the present disclosure.

FIG. 13 is a block diagram illustrating configuration of an image-capturing device that is an example of the electronic apparatus of the present disclosure. As illustrated in FIG. 13, an image-capturing device 100 according to this example has an image-capturing optical system 101 including a lens group or the like, an image-capturing unit 102, a DSP circuit 103, a frame memory 104, a display device 105, a recording device 106, an operation system 107, a power supply system 108, or the like. In addition, the DSP circuit 103, the frame memory 104, the display device 105, the recording device 106, the operation system 107, and the power supply system 108 are connected to each other via a bus line 109.

The image-capturing optical system 101 captures incident light (image light) from a photographic subject and forms an image on the image-capturing surface of the image-capturing unit 102. The image-capturing unit 102 converts the light amount of incident light formed on the image-capturing surface by the optical system 101 into an electrical signal for each pixel and outputs the electrical signal as a pixel signal. The DSP circuit 103 performs typical camera signal processing, such as white balance processing, de-mosaic processing, and gamma correction processing.

The frame memory 104 is used for storing data as appropriate in the process of signal processing in the DSP circuit 103. The display device 105 includes a panel-equipped display device such as a liquid crystal display device or an organic electroluminescence (EL) display device, and displays a moving image or a still image captured by the image-capturing unit 102. The recording device 106 records the moving image or still image captured by the image-capturing unit 102 on a recording medium such as a portable semiconductor memory, an optical disk, or a hard disk drive (HDD).

The operation system 107 issues operation commands for various functions of the image-capturing device 100 according to this example in response to the operation of the user. The power supply system 108 appropriately supplies various power supplies acting as operation power supplies for the DSP circuit 103, the frame memory 104, the display device 105, the recording device 106, and the operation system 107 to these power supply targets.

The image-capturing device 100 having the above-described configuration is capable of employing, as the image-capturing unit 102, the CMOS image sensor 1 to which the technology according to the present disclosure described above is applied. The CMOS image sensor 1 to which the technology according to the present disclosure is applied makes it possible to achieve a wide dynamic range, resulting in obtaining a high-quality image captured with little noise.

[Application Example to Moving Object]

The technology according to the present disclosure can be applied to various products. For example, the technology according to the present disclosure is implemented as apparatuses mounted on any type of mobile bodies such as automobiles, electric vehicles, hybrid electric vehicles, motorcycles, bicycles, personal mobilities, airplanes, drones, ships, robots, construction machines, and agricultural machines (tractors).

Figure 14:
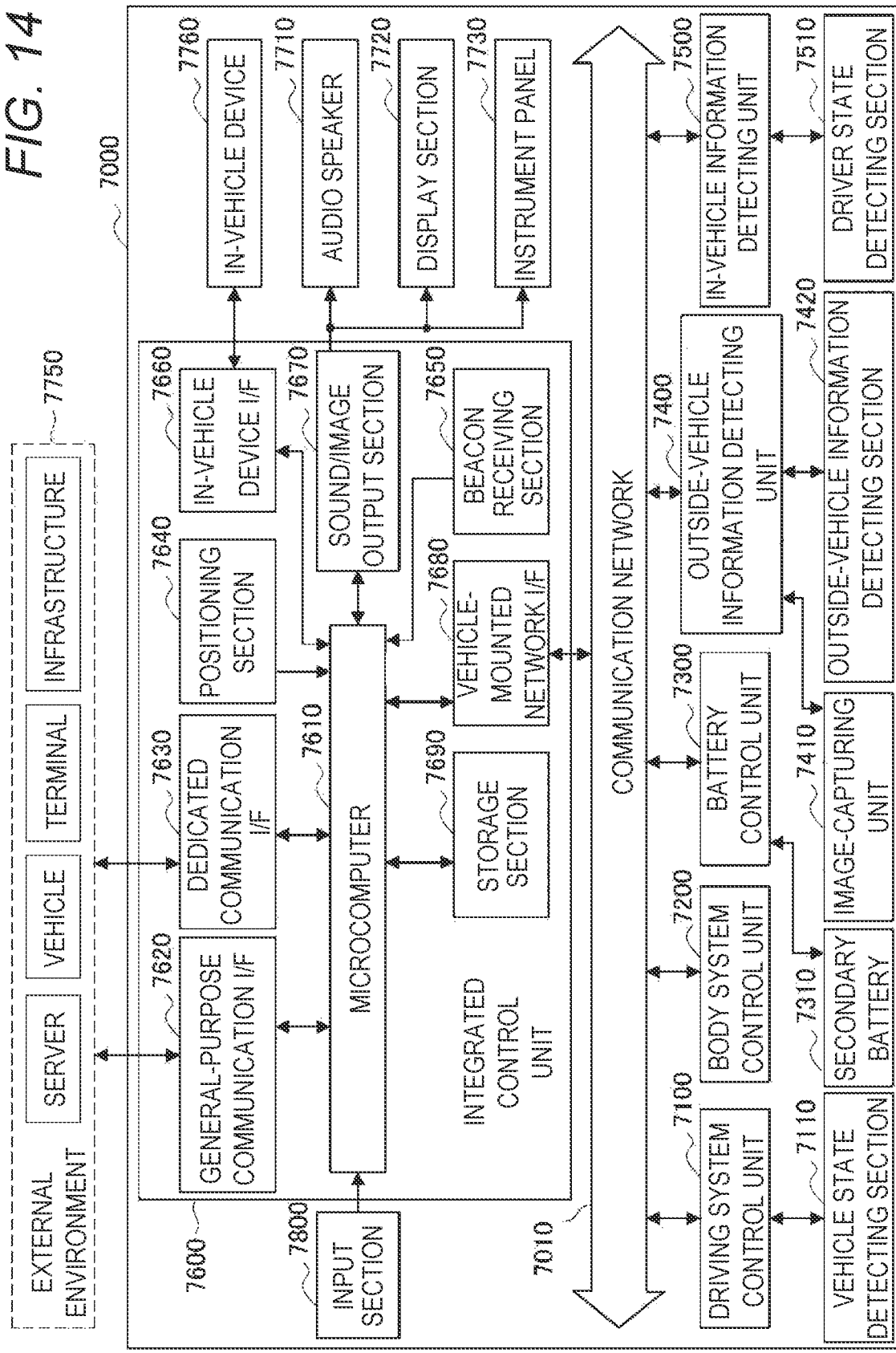
FIG. 14 is a block diagram illustrating schematic configuration example of a vehicle control system that is one example of a moving object control system to which the technology according to the present disclosure is applicable.

FIG. 14 is a block diagram depicting an example of schematic configuration of a vehicle control system 7000 as an example of a mobile body control system to which the technology according to the present disclosure can be applied. The vehicle control system 7000 includes a plurality of electronic control units connected to each other via a communication network 7010. In the example depicted in FIG. 14, the vehicle control system 7000 includes a driving system control unit 7100, a body system control unit 7200, a battery control unit 7300, an outside-vehicle information detecting unit 7400, an in-vehicle information detecting unit 7500, and an integrated control unit 7600. The communication network 7010 connecting the plurality of control units to each other may, for example, be a vehicle-mounted communication network compliant with an arbitrary standard such as controller area network (CAN), local interconnect network (LIN), local area network (LAN), FlexRay (registered trademark), or the like.

Each of the control unit includes: a microcomputer that performs arithmetic processing according to various kinds of programs; a storage section that stores the programs executed by the microcomputer, parameters used for various kinds of operations, or the like; and a driving circuit that drives various kinds of control target devices. Each of the control units further includes: a network interface (I/F) for performing communication with other control units via the communication network 7010; and a communication I/F for performing communication with a device, a sensor, or the like within and without the vehicle by wire communication or wireless communication. A functional configuration of the integrated control unit 7600 illustrated in FIG. 14 includes a microcomputer 7610, a general-purpose communication I/F 7620, a dedicated communication I/F 7630, a positioning section 7640, a beacon receiving section 7650, an in-vehicle device I/F 7660, a sound/image output section 7670, a vehicle-mounted network I/F 7680, and a storage section 7690. The other control units similarly include a microcomputer, a communication I/F, a storage section, and the like.

The driving system control unit 7100 controls the operation of devices related to the driving system of the vehicle in accordance with various kinds of programs. For example, the driving system control unit 7100 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like. The driving system control unit 7100 may have a function as a control device of an antilock brake system (ABS), electronic stability control (ESC), or the like.

The driving system control unit 7100 is connected with a vehicle state detecting section 7110. The vehicle state detecting section 7110, for example, includes at least one of a gyro sensor that detects the angular velocity of axial rotational movement of a vehicle body, an acceleration sensor that detects the acceleration of the vehicle, or sensors for detecting an amount of operation of an accelerator pedal, an amount of operation of a brake pedal, the steering angle of a steering wheel, an engine speed or the rotational speed of wheels, and the like. The driving system control unit 7100 performs arithmetic processing using a signal input from the vehicle state detecting section 7110, and controls the internal combustion engine, the driving motor, an electric power steering device, the brake device, and the like.

The body system control unit 7200 controls the operation of various kinds of devices provided to the vehicle body in accordance with various kinds of programs. For example, the body system control unit 7200 functions as a control device for a keyless entry system, a smart key system, a power window device, or various kinds of lamps such as a headlamp, a back lamp, a brake lamp, a turn signal, a fog lamp, or the like. In this case, radio waves transmitted from a mobile device as an alternative to a key or signals of various kinds of switches can be input to the body system control unit 7200. The body system control unit 7200 receives these input radio waves or signals, and controls a door lock device, the power window device, the lamps, or the like of the vehicle.

The battery control unit 7300 controls a secondary battery 7310, which is a power supply source for the driving motor, in accordance with various kinds of programs. For example, the battery control unit 7300 is supplied with information about a battery temperature, a battery output voltage, an amount of charge remaining in the battery, or the like from a battery device including the secondary battery 7310. The battery control unit 7300 performs arithmetic processing using these signals, and performs control for regulating the temperature of the secondary battery 7310 or controls a cooling device provided to the battery device or the like.

The outside-vehicle information detecting unit 7400 detects information about the outside of the vehicle including the vehicle control system 7000. For example, the outside-vehicle information detecting unit 7400 is connected with at least one of an image-capturing unit 7410 or an outside-vehicle information detecting section 7420. The image-capturing unit 7410 includes at least one of a time-of-flight (ToF) camera, a stereo camera, a monocular camera, an infrared camera, or other cameras. The outside-vehicle information detecting section 7420, for example, includes at least one of an environmental sensor for detecting current atmospheric conditions or weather conditions or a peripheral information detecting sensor for detecting another vehicle, an obstacle, a pedestrian, or the like on the periphery of the vehicle including the vehicle control system 7000.

The environmental sensor, for example, may be at least one of a rain drop sensor detecting rain, a fog sensor detecting a fog, a sunshine sensor detecting a degree of sunshine, or a snow sensor detecting a snowfall. The peripheral information detecting sensor may be at least one of an ultrasonic sensor, a radar device, or a LIDAR device (light detection and ranging device, or Laser imaging detection and ranging device). Each of the image-capturing unit 7410 and the outside-vehicle information detecting section 7420 may be provided as an independent sensor or device, or may be provided as a device in which a plurality of sensors or devices integrated.

Figure 15:
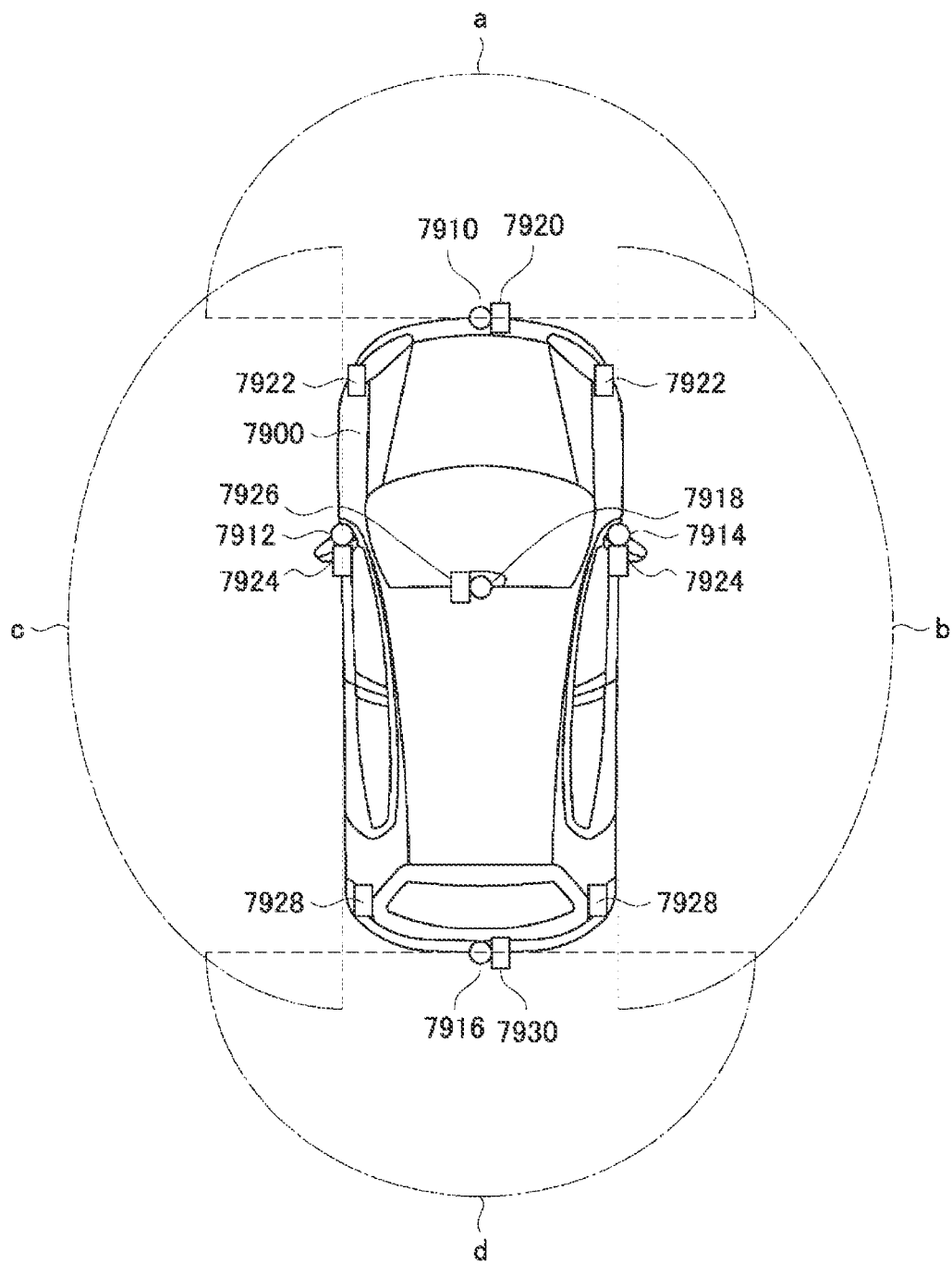
FIG. 15 is a diagram illustrating an example of an installation position of an image-capturing unit.

Here, FIG. 15 depicts an example of installation positions of the image-capturing unit 7410 and the outside-vehicle information detecting section 7420. image-capturing units 7910, 7912, 7914, 7916, and 7918 are, for example, disposed at least one of positions on a front nose, sideview mirrors, a rear bumper, or a back door and an upper portion of a windshield within the interior of the vehicle of the vehicle 7900. The image-capturing unit 7910 provided to the front nose and the image-capturing unit 7918 provided to the upper portion of the windshield within the interior of the vehicle obtain mainly an image of the front of the vehicle 7900. The image-capturing units 7912 and 7914 provided to the sideview mirrors obtain mainly an image of the sides of the vehicle 7900. The image-capturing unit 7916 provided to the rear bumper or the back door obtains mainly an image of the rear of the vehicle 7900. The image-capturing unit 7918 provided to the upper portion of the windshield within the interior of the vehicle is used mainly to detect a preceding vehicle, a pedestrian, an obstacle, a signal, a traffic sign, a lane, or the like.

Incidentally, FIG. 15 depicts an example of image-capturing ranges of the respective image-capturing units 7910, 7912, 7914, and 7916. An image-capturing range a represents the image-capturing range of the image-capturing unit 7910 provided to the front nose. Image-capturing ranges b and c respectively represent the image-capturing ranges of the image-capturing units 7912 and 7914 provided to the sideview mirrors. An image-capturing range d represents the image-capturing range of the image-capturing unit 7916 provided to the rear bumper or the back door. A bird's-eye image of the vehicle 7900 as viewed from above can be obtained by superimposing image data imaged by the image-capturing units 7910, 7912, 7914, and 7916, for example.

Outside-vehicle information detecting sections 7920, 7922, 7924, 7926, 7928, and 7930 provided to the front, rear, sides, corners, and the upper portion of the windshield within the interior of the vehicle of the vehicle 7900 may be, for example, an ultrasonic sensor or a radar device. The outside-vehicle information detecting sections 7920, 7926, and 7930 provided to the front nose, the rear bumper, the back door, and the upper portion of the windshield within the interior of the vehicle of the vehicle 7900 may be a LIDAR device, for example. These outside-vehicle information detecting sections 7920 to 7930 are used mainly to detect a preceding vehicle, a pedestrian, an obstacle, or the like.

Returning to FIG. 14, the description will be continued. The outside-vehicle information detecting unit 7400 makes the image-capturing unit 7410 image an image of the outside of the vehicle, and receives imaged image data. In addition, the outside-vehicle information detecting unit 7400 receives detection information from the outside-vehicle information detecting section 7420 connected to the outside-vehicle information detecting unit 7400. In a case where the outside-vehicle information detecting section 7420 is an ultrasonic sensor, a radar device, or a LIDAR device, the outside-vehicle information detecting unit 7400 transmits an ultrasonic wave, an electromagnetic wave, or the like, and receives information of a received reflected wave. On the basis of the received information, the outside-vehicle information detecting unit 7400 may perform processing of detecting an object such as a human, a vehicle, an obstacle, a sign, a character on a road surface, or the like, or processing of detecting a distance thereto. The outside-vehicle information detecting unit 7400 may perform environment recognition processing of recognizing a rainfall, a fog, road surface conditions, or the like on the basis of the received information. The outside-vehicle information detecting unit 7400 may calculate a distance to an object outside the vehicle on the basis of the received information.

In addition, on the basis of the received image data, the outside-vehicle information detecting unit 7400 may perform image recognition processing of recognizing a human, a vehicle, an obstacle, a sign, a character on a road surface, or the like, or processing of detecting a distance thereto. The outside-vehicle information detecting unit 7400 may subject the received image data to processing such as distortion correction, alignment, or the like, and combine the image data imaged by a plurality of different image-capturing units 7410 to generate a bird's-eye image or a panoramic image. The outside-vehicle information detecting unit 7400 may perform viewpoint conversion processing using the image data imaged by the different image-capturing units 7410.

The in-vehicle information detecting unit 7500 detects information about the inside of the vehicle. The in-vehicle information detecting unit 7500 is, for example, connected with a driver state detecting section 7510 that detects the state of a driver. The driver state detecting section 7510 may include a camera that images the driver, a biosensor that detects biological information of the driver, a microphone that collects sound within the interior of the vehicle, or the like. The biosensor is, for example, disposed in a seat surface, the steering wheel, or the like, and detects biological information of an occupant sitting in a seat or the driver holding the steering wheel. On the basis of detection information input from the driver state detecting section 7510, the in-vehicle information detecting unit 7500 may calculate a degree of fatigue of the driver or a degree of concentration of the driver, or may determine whether the driver is dozing. The in-vehicle information detecting unit 7500 may subject an audio signal obtained by the collection of the sound to processing such as noise canceling processing or the like.

The integrated control unit 7600 controls general operation within the vehicle control system 7000 in accordance with various kinds of programs. The integrated control unit 7600 is connected with an input section 7800. The input section 7800 is implemented by a device capable of input operation by an occupant, such, for example, as a touch panel, a button, a microphone, a switch, a lever, or the like. The integrated control unit 7600 may be supplied with data obtained by voice recognition of voice input through the microphone. The input section 7800 may, for example, be a remote control device using infrared rays or other radio waves, or an external connecting device such as a mobile telephone, a personal digital assistant (PDA), or the like that supports operation of the vehicle control system 7000. The input section 7800 may be, for example, a camera. In that case, an occupant can input information by gesture. Alternatively, data may be input which is obtained by detecting the movement of a wearable device that an occupant wears. Further, the input section 7800 may, for example, include an input control circuit or the like that generates an input signal on the basis of information input by an occupant or the like using the above-described input section 7800, and which outputs the generated input signal to the integrated control unit 7600. An occupant or the like inputs various kinds of data or gives an instruction for processing operation to the vehicle control system 7000 by operating the input section 7800.

The storage section 7690 may include a read only memory (ROM) that stores various kinds of programs executed by the microcomputer and a random access memory (RAM) that stores various kinds of parameters, operation results, sensor values, or the like. In addition, the storage section 7690 may be implemented by a magnetic storage device such as a hard disc drive (HDD) or the like, a semiconductor storage device, an optical storage device, a magneto-optical storage device, or the like.

The general-purpose communication I/F 7620 is a communication I/F used widely, which communication I/F mediates communication with various apparatuses present in an external environment 7750. The general-purpose communication I/F 7620 may implement a cellular communication protocol such as global system for mobile communications (GSM, registered trademark), worldwide interoperability for microwave access (WiMAX), long term evolution (LTE)), LTE-advanced (LTE-A), or the like, or another wireless communication protocol such as wireless LAN (referred to also as wireless fidelity (Wi-Fi), Bluetooth, or the like. The general-purpose communication I/F 7620 may, for example, connect to an apparatus (for example, an application server or a control server) present on an external network (for example, the Internet, a cloud network, or a company-specific network) via a base station or an access point. In addition, the general-purpose communication I/F 7620 may connect to a terminal present in the vicinity of the vehicle (which terminal is, for example, a terminal of the driver, a pedestrian, or a store, or a machine type communication (MTC) terminal) using a peer to peer (P2P) technology, for example.

The dedicated communication I/F 7630 is a communication I/F that supports a communication protocol developed for use in vehicles. The dedicated communication I/F 7630 may implement a standard protocol such, for example, as wireless access in vehicle environment (WAVE), which is a combination of institute of electrical and electronic engineers (IEEE) 802.11p as a lower layer and IEEE 1609 as a higher layer, dedicated short range communications (DSRC), or a cellular communication protocol. The dedicated communication I/F 7630 typically carries out V2X communication as a concept including one or more of communication between a vehicle and a vehicle (Vehicle to Vehicle), communication between a road and a vehicle (Vehicle to Infrastructure), communication between a vehicle and a home (Vehicle to Home), and communication between a pedestrian and a vehicle (Vehicle to Pedestrian).

The positioning section 7640, for example, performs positioning by receiving a global navigation satellite system (GNSS) signal from a GNSS satellite (for example, a GPS signal from a global positioning system (GPS) satellite), and generates positional information including the latitude, longitude, and altitude of the vehicle. Incidentally, the positioning section 7640 may identify a current position by exchanging signals with a wireless access point, or may obtain the positional information from a terminal such as a mobile telephone, a personal handy phone system (PHS), or a smart phone that has a positioning function.

The beacon receiving section 7650, for example, receives a radio wave or an electromagnetic wave transmitted from a wireless station installed on a road or the like, and thereby obtains information about the current position, congestion, a closed road, a necessary time, or the like. Incidentally, the function of the beacon receiving section 7650 may be included in the dedicated communication I/F 7630 described above.

The in-vehicle device I/F 7660 is a communication interface that mediates connection between the microcomputer 7610 and various in-vehicle devices 7760 present within the vehicle. The in-vehicle device I/F 7660 may establish wireless connection using a wireless communication protocol such as wireless LAN, Bluetooth, near field communication (NFC), or wireless universal serial bus (WUSB). In addition, the in-vehicle device I/F 7660 may establish wired connection by universal serial bus (USB), high-definition multimedia interface (HDMI, registered trademark), mobile high-definition link (MHL), or the like via a connection terminal (and a cable if necessary) not depicted in the figures. The in-vehicle devices 7760 may, for example, include at least one of a mobile device and a wearable device possessed by an occupant or an information device carried into or attached to the vehicle. Further, the in-vehicle devices 7760 may also include a navigation device that searches for a path to an arbitrary destination. The in-vehicle device I/F 7660 exchanges control signals or data signals with these in-vehicle devices 7760.

The vehicle-mounted network I/F 7680 is an interface that mediates communication between the microcomputer 7610 and the communication network 7010. The vehicle-mounted network I/F 7680 transmits and receives signals or the like in conformity with a predetermined protocol supported by the communication network 7010.

The microcomputer 7610 of the integrated control unit 7600 controls the vehicle control system 7000 in accordance with various kinds of programs on the basis of information obtained via at least one of the general-purpose communication I/F 7620, the dedicated communication I/F 7630, the positioning section 7640, the beacon receiving section 7650, the in-vehicle device I/F 7660, or the vehicle-mounted network I/F 7680. For example, the microcomputer 7610 may calculate a control target value for the driving force generating device, the steering mechanism, or the braking device on the basis of the obtained information about the inside and outside of the vehicle, and output a control command to the driving system control unit 7100. For example, the microcomputer 7610 may perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like. In addition, the microcomputer 7610 may perform cooperative control intended for automatic driving, which makes the vehicle to travel autonomously without depending on the operation of the driver, or the like, by controlling the driving force generating device, the steering mechanism, the braking device, or the like on the basis of the obtained information about the surroundings of the vehicle.

The microcomputer 7610 may generate three-dimensional distance information between the vehicle and an object such as a surrounding structure, a person, or the like, and generate local map information including information about the surroundings of the current position of the vehicle, on the basis of information obtained via at least one of the general-purpose communication I/F 7620, the dedicated communication I/F 7630, the positioning section 7640, the beacon receiving section 7650, the in-vehicle device I/F 7660, or the vehicle-mounted network I/F 7680. In addition, the microcomputer 7610 may predict danger such as collision of the vehicle, approaching of a pedestrian or the like, an entry to a closed road, or the like on the basis of the obtained information, and generate a warning signal. The warning signal may, for example, be a signal for producing a warning sound or lighting a warning lamp.

The sound/image output section 7670 transmits an output signal of at least one of a sound or an image to an output device capable of visually or auditorily notifying an occupant of the vehicle or the outside of the vehicle of information. In the example of FIG. 14, an audio speaker 7710, a display section 7720, and an instrument panel 7730 are illustrated as the output device. The display section 7720 may, for example, include at least one of an on-board display or a head-up display. The display section 7720 may have an augmented reality (AR) display function. The output device may be other than these devices, and may be another device such as headphones, a wearable device such as an eyeglass type display worn by an occupant or the like, a projector, a lamp, or the like. In a case where the output device is a display device, the display device visually displays results obtained by various kinds of processing performed by the microcomputer 7610 or information received from another control unit in various forms such as text, an image, a table, a graph, or the like. In addition, in a case where the output device is an audio output device, the audio output device converts an audio signal constituted of reproduced audio data or sound data or the like into an analog signal, and auditorily outputs the analog signal.

Incidentally, at least two control units connected to each other via the communication network 7010 in the example depicted in FIG. 14 may be integrated into one control unit. Alternatively, each individual control unit may include a plurality of control units. Further, the vehicle control system 7000 may include another control unit not depicted in the figures. In addition, part or the whole of the functions performed by one of the control units in the above description may be assigned to another control unit. That is, predetermined arithmetic processing may be performed by any of the control units as long as information is transmitted and received via the communication network 7010. Similarly, a sensor or a device connected to one of the control units may be connected to another control unit, and a plurality of control units may mutually transmit and receive detection information via the communication network 7010.

The exemplary vehicle control system to which the technology according to the present disclosure is applicable is described above. The technology according to the present disclosure is applicable to, in one example, the image-capturing units 7910, 7912, 7914, 7916, and 7918 and the outside-vehicle information detecting sections 7920, 7922, 7924, 7926, 7928, and 7930 among the components described above. In addition, the application of the technology according to the present disclosure to the image-capturing units 7910, 7912, 7914, 7916, and 7918 or the outside-vehicle information detecting sections 7920, 7922, 7924, 7926, 7928, and 7930 makes it possible to achieve an increased dynamic range and obtain a high-quality image captured with little noise, resulting in, in one example, building up a vehicle control system that is detectable an image-capturing target with high accuracy.

<Configuration that can be Configured by Present Disclosure>

The present disclosure may include the following configuration.

<<A. Solid-State Image Sensor>>

[A-1] A solid-state image sensor including:

a pixel array section including a plurality of unit pixels each having a photoelectric conversion unit, the plurality of unit pixels being arranged in a matrix;

a constant current source circuit unit having a constant current source connected to each of vertical signal lines provided in association with column arrangement of the pixel array section; and a control unit configured to control the constant current source circuit unit, in which the constant current source includes a plurality of transistors, and the control unit switches, in a case where the plurality of transistors constituting the constant current source is regarded as one transistor having a gate width and a gate length being equivalent to each other, a ratio between the gate width and the gate length of the plurality of transistors on the basis of illumination in image-capturing environment.

[A-2] The solid-state image sensor according to [A-1] described above, in which the control unit switches the ratio between the gate width and the gate length of the plurality of transistors between upon image-capturing in low-illumination environment and upon image-capturing in high-illumination environment.

[A-3] The solid-state image sensor according to [A-2] described above, in which the solid-state image sensor is capable of setting a noise priority mode and a range priority mode, the noise priority mode to be set upon image-capturing in low-illumination environment, the range priority mode to be set upon image-capturing in high-illumination environment, and the control unit switches the ratio between the gate width and the gate length of the plurality of transistors depending on the priority mode to be set.

[A-4] The solid-state image sensor according to [A-3] described above, in which the control unit switches a connection state between the plurality of transistors constituting the constant current source and switches a setting of a gate bias of the plurality of transistors depending on the priority mode to be set.

[A-5] The solid-state image sensor according to [A-3] or [A-4] described above, in which the control unit relatively increases the ratio between the gate width and the gate length upon setting the range priority mode and relatively decreases the ratio between the gate width and the gate length upon setting the noise priority mode.

[A-6] The solid-state image sensor according to any one of [A-2] to [A-5] described above, in which the constant current source has a first transistor, a second transistor, and a switch element, the first transistor and the second transistor being connected in series between the vertical signal line and a reference potential node, the switch element being connected in parallel to one of the first transistor and the second transistor, and the control unit turns on the switch element upon image-capturing in high-illumination environment and turns off the switch element upon image-capturing in low-illumination environment.

[A-7] The solid-state image sensor according to any one of [A-2] to [A-5] described above, in which the constant current source has a first transistor and a second transistor connected in parallel between the vertical signal line and a reference potential node, and the control unit applies a gate bias voltage to the first transistor and the second transistor upon image-capturing in high-illumination environment and applies the gate bias voltage to one of the first transistor and the second transistor to turn off the other one upon image-capturing in low-illumination environment.

[A-8] The solid-state image sensor according to any one of [A-2] to [A-5], in which the constant current source has a first switch element and a first transistor connected in series between the vertical signal line and a reference potential node, a second transistor and a second switch element connected in series between the vertical signal line and the reference potential node, and a third switch element connected between a connection node of the first switch element and the first transistor and a connection node of the second transistor and the second switch element, and the control unit turns off the first switch element and the second switch element and turns on the third switch element upon image-capturing in low-illumination environment, and turns on the first switch element and the second switch element and turns off the third switch element upon image-capturing in high-illumination environment.

[A-9] The solid-state image sensor according to [A-1] described above, in which the solid-state image sensor is capable of setting an analog gain for a pixel signal to be read out from the unit pixel through the vertical signal line, and the control unit switches the ratio between the gate width and the gate length of the plurality of transistors depending on the analog gain to be set.

[A-10] The solid-state image sensor according to [A-9] described above, in which the analog gain is capable of being set in a plurality of stages, and the control unit switches the ratio of the gate width and the gate length in a plurality of stages depending on the analog gain to be set.

[A-11] The solid-state image sensor according to [A-9] or [A-10] described above, in which the control unit switches a connection state between the plurality of transistors constituting the constant current source and switches a setting of a gate bias of the plurality of transistors depending on the analog gain to be set.

[A-12] The solid-state image sensor according to any one of [A-1] to [A-11] described above, in which the solid-state image sensor has a stacked structure including at least two semiconductor substrates of a first semiconductor substrate and a second semiconductor substrate arranged one on top of the other, the pixel array section is formed on the first semiconductor substrate, and the constant current source circuit unit is formed on a substrate other than the first semiconductor substrate.

<<B. Method of Driving the Solid-State Image Sensor>>

[B-1] A method of driving the solid-state image sensor includes, in a case of driving the solid-state image sensor provided with a pixel array section including a plurality of unit pixels each having a photoelectric conversion unit, the plurality of unit pixels being arranged in a matrix, and a constant current source circuit unit having a constant current source connected to each of vertical signal lines provided in association with column arrangement of the pixel array section, switching, in a case where a plurality of transistors constituting the constant current source is regarded as one transistor having a gate width and a gate length being equivalent to each other, a ratio between the gate width and the gate length of the plurality of transistors on the basis of illumination in image-capturing environment.

[B-2] The method for driving the solid-state image sensor according to [B-1] described above including, switching the ratio between the gate width and the gate length of the plurality of transistors between upon image-capturing in low-illumination environment and upon image-capturing in high-illumination environment.

[B-3] The method for driving the solid-state image sensor according to [B-2] described above, in which the solid-state image sensor is capable of setting a noise priority mode and a range priority mode, the noise priority mode to be set upon image-capturing in low-illumination environment, the range priority mode to be set upon image-capturing in high-illumination environment, and the ratio between the gate width and the gate length of the plurality of transistors is switched depending on the priority mode to be set.

[B-4] The method for driving the solid-state image sensor according to [B-3] described above in which a connection state between the plurality of transistors is switched and a setting of a gate bias of the plurality of transistors is switched depending on the priority mode to be set.

[A-5] The method for driving the solid-state image sensor according to [A-3] or [A-4] described above, in which the ratio between the gate width and the gate length are relatively increased upon setting the range priority mode and the ratio between the gate width and the gate length are relatively decreased upon setting the noise priority mode.

[B-6] The method for driving the solid-state image sensor according to [B-1] described above, in which the solid-state image sensor is capable of setting an analog gain for a pixel signal to be read out from the unit pixel through the vertical signal line, and the ratio between the gate width and the gate length of the plurality of transistors is switched depending on the analog gain to be set.

[B-7] The method for driving the solid-state image sensor according to [B-6] described above, in which the analog gain is capable of being set in a plurality of stages, and the ratio of the gate width and the gate length is switched in a plurality of stages depending on the analog gain to be set.

<<C. Electronic Apparatus>>

[C-1] An electronic apparatus including a solid-state image sensor including a pixel array section including a plurality of unit pixels each having a photoelectric conversion unit, the plurality of unit pixels being arranged in a matrix, a constant current source circuit unit having a constant current source connected to each of vertical signal lines provided in association with column arrangement of the pixel array section, and a control unit configured to control the constant current source circuit unit, in which the constant current source includes a plurality of transistors, and the control unit switches, in a case where the plurality of transistors constituting the constant current source is regarded as one transistor having a gate width and a gate length being equivalent to each other, a ratio between the gate width and the gate length of the plurality of transistors on the basis of illumination in image-capturing environment.

[C-2] The electronic apparatus according to [C-1] described above, in which the control unit switches the ratio between the gate width and the gate length of the plurality of transistors between upon image-capturing in low-illumination environment and upon image-capturing in high-illumination environment.

[C-3] The electronic apparatus according to [C-2] described above, in which the solid-state image sensor is capable of setting a noise priority mode and a range priority mode, the noise priority mode to be set upon image-capturing in low-illumination environment, the range priority mode to be set upon image-capturing in high-illumination environment, and the control unit switches the ratio between the gate width and the gate length of the plurality of transistors depending on the priority mode to be set.

[C-4] The electronic apparatus according to [C-3] described above, in which the control unit switches a connection state between the plurality of transistors constituting the constant current source and switches a setting of a gate bias of the plurality of transistors depending on the priority mode to be set.

[C-5] The electronic apparatus according to [C-3] or [C-4] described above, in which the control unit relatively increases the ratio between the gate width and the gate length upon setting the range priority mode and relatively decreases the ratio between the gate width and the gate length upon setting the noise priority mode.

[C-6] The electronic apparatus according to any one of [C-2] to [C-5] described above,
in which the constant current source has a first transistor, a second transistor, and a switch element, the first transistor and the second transistor being connected in series between the vertical signal line and a reference potential node, the switch element being connected in parallel to one of the first transistor and the second transistor, and
the control unit turns on the switch element upon image-capturing in high-illumination environment and turns off the switch element upon image-capturing in low-illumination environment.

[C-7] The electronic apparatus according to any one of [C-2] to [C-5] described above,
in which the constant current source has a first transistor and a second transistor connected in parallel between the vertical signal line and a reference potential node, and
the control unit applies a gate bias voltage to the first transistor and the second transistor upon image-capturing in high-illumination environment and applies the gate bias voltage to one of the first transistor and the second transistor to turn off the other one upon image-capturing in low-illumination environment.

[C-8] The electronic apparatus according to any one of [C-2] to [C-5],
in which the constant current source has
a first switch element and a first transistor connected in series between the vertical signal line and a reference potential node,
a second transistor and a second switch element connected in series between the vertical signal line and the reference potential node, and
a third switch element connected between a connection node of the first switch element and the first transistor and a connection node of the second transistor and the second switch element, and
the control unit
turns off the first switch element and the second switch element and turns on the third switch element upon image-capturing in low-illumination environment, and
turns on the first switch element and the second switch element and turns off the third switch element upon image-capturing in high-illumination environment.

[C-9] The electronic apparatus according to [C-1] described above,
in which the solid-state image sensor is capable of setting an analog gain for a pixel signal to be read out from the unit pixel through the vertical signal line, and
the control unit switches the ratio between the gate width and the gate length of the plurality of transistors depending on the analog gain to be set.

[C-10] The electronic apparatus according to [C-9] described above,
in which the analog gain is capable of being set in a plurality of stages, and
the control unit switches the ratio of the gate width and the gate length in a plurality of stages depending on the analog gain to be set.

[C-11] The electronic apparatus according to [C-9] or [C-10] described above,
in which the control unit switches a connection state between the plurality of transistors constituting the constant current source and switches a setting of a gate bias of the plurality of transistors depending on the analog gain to be set.

[C-12] The electronic apparatus according to any one of [C-1] to [C-11] described above,
in which the solid-state image sensor has a stacked structure including at least two semiconductor substrates of a first semiconductor substrate and a second semiconductor substrate arranged one on top of the other,
the pixel array section is formed on the first semiconductor substrate, and
the constant current source circuit unit is formed on a substrate other than the first semiconductor substrate.

REFERENCE SIGNS LIST

1 CMOS image sensor (solid-state image sensor)
2 Unit pixel
11 Pixel array section
12 Row selection unit
13 Constant current source circuit unit
14 Constant current source control unit
15 Analog-to-digital conversion unit
16 Storage unit
17 Data processing unit
18 Output unit
19 Timing control unit
21 Photodiode (photoelectric conversion unit)
22 Transfer transistor
23 Reset transistor
24 Amplification transistor
25 Selection transistor
$31(31_1$ to $31_m)$ Pixel drive line
$32(32_1$ to $32_n)$ Vertical signal line
$131(131_1$ to $131_n)$ Constant current source

What is claimed is:

1. A light detecting device, comprising:
a pixel array section including a plurality of pixels in a matrix, wherein
a pixel of the plurality of pixels includes a photoelectric conversion unit; and
current source circuitry including a current source, wherein
the current source is connected to a vertical signal line,
the vertical signal line is in a column direction of the pixel array section,
the current source includes a first transistor and a second transistor,
a first ratio between a gate width and a gate length of the first transistor is different from a second ratio between a gate width and a gate length of the second transistor,
the light detecting device has a stacked structure including at least two semiconductor substrates,
the at least two semiconductor substrates include a first semiconductor substrate and a second semiconductor substrate,
the first semiconductor substrate is on top of the second semiconductor substrate,
the pixel array section is on the first semiconductor substrate, and
the current source circuitry is on a specific substrate different from the first semiconductor substrate.

2. The light detecting device according to claim 1, further comprising a control circuit configured to:
control the current source circuitry, wherein
a priority mode of the light detecting device comprises a noise priority mode and a range priority mode,
the noise priority mode is settable for image-capture in low-illumination environment, and the range priority mode is settable for image-capture in high-illumination environment; and switch the first ratio between the gate width and the gate length of the first transistor and the second ratio between the gate width and the gate length of the second transistor based on the priority mode to be set.

3. The light detecting device according to claim 2, wherein the control circuit is further configured to:

switch a connection state between the first transistor and the second transistor; and switch a setting of a gate bias of each of the first transistor and the second transistor based on the priority mode to be set.

4. The light detecting device according to claim 2, wherein the control circuit is further configured to:

relatively increase the first ratio and the second ratio in the range priority mode; and relatively decrease the first ratio and the second ratio in the noise priority mode.

5. The light detecting device according to claim 2, wherein the first transistor and the second transistor are connected in series between the vertical signal line and a reference potential node, the current source further includes a switch element, the switch element is connected in parallel to one of the first transistor or the second transistor, and the control circuit is further configured to:

turn on the switch element based on the image-capture in the high-illumination environment; and turn off the switch element based on the image-capture in the low-illumination environment.

6. The light detecting device according to claim 2, wherein the first transistor and the second transistor are connected in parallel between the vertical signal line and a reference potential node, and the control circuit is further configured to:

apply a gate bias voltage to each of the first transistor and the second transistor based on the image-capture in the high-illumination environment; and apply the gate bias voltage to one of the first transistor to turn off the second transistor or the second transistor, to turn off the first transistor, based on the image-capture in the low-illumination environment.

7. The light detecting device according to claim 2, wherein the current source further includes:

a first switch element connected in series between the vertical signal line and a reference potential node;

a second switch element connected in series between the vertical signal line and the reference potential node; and a third switch element connected between a connection node of the first switch element and the first transistor and a connection node of the second transistor and the second switch element, and the control circuit is further configured to:

turn off each of the first switch element and the second switch element and turn on the third switch element based on the image-capture in the low-illumination environment; and turn on the first switch element and the second switch element and turn off the third switch element based on the image-capture in the high-illumination environment.

8. The light detecting device according to claim 2, wherein the light detecting device is configured to set an analog gain for a pixel signal to be read out from one of the plurality of pixels, the pixel signal is read out through the vertical signal line, and the control circuit is further configured to switch the first ratio between the gate width and the gate length of the first transistor and the second ratio between the gate width and the gate length of the second transistor based on the set analog gain.

9. The light detecting device according to claim 8, wherein the analog gain is set in a plurality of stages, and the control circuit is further configured to switch the first ratio between the gate width and the gate length of the first transistor and the second ratio between the gate width and the gate length of the second transistor in the plurality of stages based on the set analog gain.

10. The light detecting device according to claim 8, wherein the control circuit is further configured to:

switch a connection state between the first transistor and the second transistor; and switch a setting of a gate bias of the first transistor and the second transistor based on the set analog gain.

11. The light detecting device according to claim 1, wherein the gate width of the first transistor is equal to the gate length of the first transistor, and the gate width of the second transistor is equal to the gate length of the second transistor.

12. A method of driving a light detecting device, the method comprising:

in the light detecting device including:

a pixel array section, wherein the pixel array section includes a plurality of pixels in a matrix, and a pixel of the plurality of pixels includes a photo-electric conversion unit; and current source circuitry having a current source connected to a vertical signal line provided in association with column arrangement of the pixel array section, wherein the current source includes a first transistor and a second transistor, the light detecting device has a stacked structure including at least two semiconductor substrates, the at least two semiconductor substrates include a first semiconductor substrate and a second semiconductor substrate, the first semiconductor substrate is on top of the second semiconductor substrate, the pixel array section is on the first semiconductor substrate, and the current source circuitry is on a specific substrate different from the first semiconductor substrate:

controlling a first ratio between a gate width and a gate length of the first transistor to be different from a second ratio between a gate width and a gate length of the second transistor.

13. The method of driving the light detecting device according to claim 12, further comprising:

switching a connection state between the first transistor and the second transistor, wherein a priority mode of the light detecting device comprises a noise priority mode and a range priority mode, the noise priority mode is settable for image-capture in low-illumination environment, and the range priority mode is settable for image-capture in high-illumination environment; and switching a setting of a gate bias of each of the first transistor and the second transistor based on the priority mode to be set.

14. The method of driving the light detecting device according to claim 13, further comprising:

increasing the first ratio and the second ratio in the range priority mode; and decreasing the first ratio and the second ratio in the noise priority mode.

15. The method of driving the light detecting device according to claim 12, further comprising:

setting an analog gain for a pixel signal to be read out from one of the plurality of pixels, wherein the pixel signal is read out through the vertical signal line; and switching the first ratio between the gate width and the gate length of the first transistor and the second ratio between the gate width and the gate length of the second transistor based on the set analog gain.

16. The method of driving the light detecting device according to claim 15, further comprising:

setting the analog gain in a plurality of stages; and switching the first ratio between the gate width and the gate length of the first transistor and the second ratio between the gate width and the gate length of the second transistor in the plurality of stages based on the set analog gain.

17. An electronic apparatus, comprising:
a light detecting device that comprises:
  a pixel array section, wherein
    the pixel array section includes a plurality of pixels in a matrix,
    a pixel of the plurality of pixels includes a photoelectric conversion unit; and
  current source circuitry including a current source, wherein
    the current source is connected to a vertical signal line,
    the vertical signal line is in a column direction of the pixel array section,
    the current source includes a first transistor and a second transistor, and
    a first ratio between a gate width and a gate length of the first transistor is different from a second ratio between a gate width and a gate length of the second transistor,
    the light detecting device has a stacked structure including at least two semiconductor substrates,
    the at least two semiconductor substrates include a first semiconductor substrate and a second semiconductor substrate,
    the first semiconductor substrate is on top of the second semiconductor substrate,
    the pixel array section is on the first semiconductor substrate, and
    the current source circuitry is on a specific substrate different from the first semiconductor substrate.

* * * * *